US009736579B2

(12) United States Patent
Taffler et al.

(10) Patent No.: US 9,736,579 B2
(45) Date of Patent: Aug. 15, 2017

(54) MULTICHANNEL WAVEFORM SYNTHESIS ENGINE

(71) Applicant: uBeam Inc., Santa Monica, CA (US)

(72) Inventors: Sean Taffler, Pacific Palisades, CA (US); Andrew Joyce, Venice, CA (US); Alex Whittemore, Redondo Beach, CA (US); Jonathan Bolus, Santa Monica, CA (US); Nikola Djokic, Redlands, CA (US); Brian Kang, Los Angeles, CA (US)

(73) Assignee: uBeam Inc., Santa Monica, CA (US)

( * ) Notice: Subject to any disclaimer, the term of this patent is extended or adjusted under 35 U.S.C. 154(b) by 128 days.

(21) Appl. No.: 14/717,869

(22) Filed: May 20, 2015

(65) Prior Publication Data

US 2016/0345093 A1 Nov. 24, 2016

(51) Int. Cl.
*H04L 7/00* (2006.01)
*H04R 3/00* (2006.01)
(Continued)

(52) U.S. Cl.
CPC ............... *H04R 3/00* (2013.01); *H04S 3/008* (2013.01); *H04L 7/00* (2013.01); *H04R 27/00* (2013.01); *H04R 2227/003* (2013.01)

(58) Field of Classification Search
CPC .................................. H04R 3/00; H03L 7/00
See application file for complete search history.

(56) References Cited

U.S. PATENT DOCUMENTS 3,946,831 A 3/1976 Bouyoucos
4,134,106 A * 1/1979 Hungerford .......... H03M 1/485
318/569
(Continued)

FOREIGN PATENT DOCUMENTS

CN 102184729 A 9/2011
EP 1423685 B1 8/2011
(Continued)

OTHER PUBLICATIONS

Invitation to Pay Additional Fees and Partial International Search Report for PCT/US2014/028133 mailed Jul. 18, 2014.
(Continued)

*Primary Examiner* — Jean B Corrielus
(74) *Attorney, Agent, or Firm* — Morris & Kamlay LLP

(57) ABSTRACT

Systems and techniques are provided for a multichannel waveform synthesis engine. A phase counter module counts to a value corresponding to a number of phases available, outputs a phase counter value indicating a current phase, and resets the phase counter value when the phase counter value reaches a phase counter reset value. Several channels each output a waveform. Each channel includes a phase module that receives the phase counter value output from the phase counter module, and activates an activation signal when the phase counter value indicates a phase assigned to the channel from the number of phases available. Each channel includes a pulse width module that receives the activation signal, and when the activation signal is activated, activates a waveform for a period of time indicated by a pulse width assigned to the channel, and deactivates the waveform after the period of time indicated by the pulse width assigned to the channel.

37 Claims, 18 Drawing Sheets

(51) Int. Cl.
*H04S 3/00* (2006.01)
*H04R 27/00* (2006.01)

(56) References Cited

U.S. PATENT DOCUMENTS

| | | | |
|---|---|---|---|
| 5,198,716 | A | 3/1993 | Godshall et al. |
| 5,376,221 | A | 12/1994 | Staudte |
| 5,436,523 | A | 7/1995 | Staudte |
| 6,003,390 | A | 12/1999 | Cousy et al. |
| 6,037,704 | A | 3/2000 | Welle |
| 6,127,942 | A | 10/2000 | Welle |
| 6,479,890 | B1 | 11/2002 | Trieu et al. |
| 6,798,716 | B1 | 9/2004 | Charych |
| 7,174,502 | B2 * | 2/2007 | Miyamoto ............ H03M 13/33 714/744 |
| 7,362,152 | B2 | 4/2008 | Fbigoli |
| 7,446,456 | B2 | 11/2008 | Maruyama et al. |
| 7,489,967 | B2 | 2/2009 | Von Arx et al. |
| 7,490,519 | B2 | 2/2009 | Subramanian et al. |
| 7,606,621 | B2 | 10/2009 | Brisken et al. |
| 7,610,092 | B2 | 10/2009 | Cowan et al. |
| 7,710,002 | B2 | 5/2010 | Horie et al. |
| 7,902,943 | B2 | 3/2011 | Sherrit et al. |
| 8,082,041 | B1 | 12/2011 | Radziemski |
| 8,159,364 | B2 | 4/2012 | Zeine |
| 8,310,112 | B2 | 11/2012 | Joos et al. |
| 8,558,632 | B2 | 10/2013 | Kris |
| 8,649,875 | B2 | 2/2014 | Sarvazyan |
| 8,653,873 | B2 | 2/2014 | Cook |
| 8,816,567 | B2 | 8/2014 | Zuo et al. |
| 2001/0035700 | A1 | 11/2001 | Percin et al. |
| 2003/0020376 | A1 | 1/2003 | Sakaguchi et al. |
| 2004/0066708 | A1 | 4/2004 | Ogawa |
| 2004/0172083 | A1 | 9/2004 | Penner |
| 2004/0204744 | A1 | 10/2004 | Penner et al. |
| 2005/0070962 | A1 | 3/2005 | Echt et al. |
| 2005/0207589 | A1 | 9/2005 | Biegelsen |
| 2007/0109121 | A1 | 5/2007 | Cohen |
| 2007/0150019 | A1 | 6/2007 | Youker et al. |
| 2008/0080267 | A1 * | 4/2008 | Lee ...................... G11C 7/1051 365/191 |
| 2008/0184549 | A1 | 8/2008 | Nguyen-Dinh et al. |
| 2008/0309452 | A1 | 12/2008 | Zeine |
| 2010/0027379 | A1 | 2/2010 | Saulnier et al. |
| 2010/0157019 | A1 | 6/2010 | Schwotzer et al. |
| 2010/0164433 | A1 | 7/2010 | Janefalkar et al. |
| 2010/0286744 | A1 | 11/2010 | Echt et al. |
| 2010/0315045 | A1 | 12/2010 | Zeine |
| 2012/0193999 | A1 | 8/2012 | Zeine |
| 2012/0299540 | A1 | 11/2012 | Perry |
| 2012/0299541 | A1 | 11/2012 | Perry |
| 2012/0299542 | A1 | 11/2012 | Perry |
| 2012/0300588 | A1 | 11/2012 | Perry |
| 2012/0300592 | A1 | 11/2012 | Perry |
| 2012/0300593 | A1 | 11/2012 | Perry |
| 2013/0069865 | A1 | 3/2013 | Hart et al. |
| 2013/0207604 | A1 | 8/2013 | Zeine |
| 2013/0239700 | A1 | 9/2013 | Benfield et al. |
| 2013/0241468 | A1 | 9/2013 | Moshfeghi |
| 2013/0264663 | A1 | 10/2013 | Dehe et al. |
| 2013/0271088 | A1 | 10/2013 | Hwang et al. |

FOREIGN PATENT DOCUMENTS

| | | |
|---|---|---|
| GB | 2386028 A | 9/2003 |
| JP | 07327299 A | 12/1995 |
| JP | 2002118440 A | 4/2002 |
| JP | 2007-306389 | 11/2007 |
| JP | 2008244964 A | 10/2008 |
| JP | 5435243 | 12/2013 |
| KR | 10-2009-0118873 | 12/2009 |
| WO | 00/21020 | 4/2000 |
| WO | 2006/069215 | 6/2006 |
| WO | 2012166583 A1 | 12/2012 |
| WO | 2013143630 A1 | 10/2013 |

OTHER PUBLICATIONS

Bao, et al., "High-power piezoelectric acoustic-electric power feedthru for metal walls", Proceedings of SPIE, vol. 6930, pp. 1-8, 2008.
Bao, et al., "Wireless piezoelectric acoustic-electric power feedthru", Proceedings of SPIE, vol. 6529, pp. 1-7, 2007.
Etherington, "Cota By Ossia Aims To Drive A Wireless Power Revolution And Change How We Think About Charging", Available at: http://techcrunch.com/2013/09/09/cota-by-ossia-wireless-power/. Date visited: Sep. 12, 2013, pp. 1-4, Sep. 9, 2013.
Germano, "Flexure Mode Piezoelectric Transducers", Morgan Electro Ceramics, Technical Publication TP-218. J. Acoust. Soc. Am. Volume 50, Issue 1A, pp. 1-6, 1971.
Intellectual Ventures, "MSA-T", Available at: http://www.intellectualventures.com/index.php/inventions-patents/our-inventions/msa-t. Date visited: Mar. 21, 2013., 2013.
Intellectual Ventures, "MSA-T: Enabling affordable, all-electronic beam steering satcom user terminals", Available at: http://www.intellectualventures.com/assets_docs/IV_metamaterials_technical_overview.pdf. Visited on: Mar. 21, 2013, 2011.
International Search Report in International Application No. PCT/US2012/039536 mailed Aug. 14, 2012.
Jiang, et al., "Multi-Channel Indoor Wireless Data Communication Using High-k Capacitive Ultrasonic Transducers in Air", Ultrasonics Symposium (IUS), 2013 IEEE International, Jul. 2013, Prague pp. 1606-1609, ISSN: 1948-5719.
Mobilitywire, "Ossia Unveils World's First Commercially Viable Remote Wireless Power System", Available at: http://www.mobilitywire.com/ossia/2013/09/10788. Date visited: Sep. 12, 2013, pp. 1-4, Sep. 10, 2013.
Morgan Electro Ceramics, "Cantilever Mounted PZT 5A Bimorphs", Technical Publication TP-245, pp. 1-8, 1999.
Murray, Susan L., et al., "Effect of mesa-shaping on spurious modes in ZnO/Si bulk-wave composite resonators", Institute of Electrical and Electronics Engineers, 1983, 498-503.
Nam-Trung Nguyen, et al., "Acoustic streaming in micromachined flexural plate wave devices: numerical simulation and experimental verification", IEEE Transactions on Ultrasonics, Ferroelectrics, and Frequency Control (vol. 47, Issue: 6), Nov. 2000, 1463-1471.
S Tadigadapa, et al., "Piezoelectric MEMS sensors: state-of-the-art and perspectives", Measurement Science and Technology vol. 20 No. 9 Meas. Sci. Technol. 20 092001 doi:10.1088/0957-0233/20/9/092001, 2009.
Sherrit, et al., "Comparison of the Mason and KLM Equivalent Circuits for Piezoelectric Resonators in the Thickness Mode", IEEE Ultrasonics Symposium, vol. 2, pp. 921-926, 1999.
Sherrit, et al., "Efficient Electromechanical Network Models for Wireless Acoustic-Electric Feed-throughs", Proceedings of the SPIE Smart Structures Conference, vol. 5758, pp. 362-372, Mar. 6-10, 2005.
Sherrit, et al., "Solid Micro Horn Array (SMIHA) for Acoustic Matching", Proceedings of SPIE, vol. 6932, pp. 1-9, 2008.
Sherrit, et al., "Studies of Acoustic-Electric Feed-throughs for Power Transmission Through Structures", Proceedings of SPIE, vol. 6171, pp. 1-8, 2006.
Sherrit, "The Physical Acoustics of Energy Harvesting", IEEE International Ultrasonics Symposium Proceedings, pp. 1046-1055, 2008.
Soeren Hirsch, et al., "A new device with PZT ultrasonic transducers in MEMS technology", Journal of Physics: Conference Series vol. 34; J. Phys.: Conf. Ser. 34 475 doi:10.1088/1742-6596/34/1/078, 2006.
Takashi Abe, et al., "Inverted Mesa-Type Quartz Crystal Resonators Fabricated by Deep-Reactive Ion Etching", IEEE Transactions on Ultrasonics, Ferroelectrics, and Frequency Control, vol. 53, No. 7, Jul. 2006, 1234.
International Search Report and Written Opinion dated Aug. 16, 2016 as received in Application No. PCT/US2016/033124.

* cited by examiner

MULTICHANNEL WAVEFORM SYNTHESIS ENGINE

BACKGROUND

When used for certain applications, a signal can be required to have a given phase and pulse width. The required phases and pulse widths can change over time. In some applications, it is necessary to generate a large number of such signals, often with changing phase and pulse width requirements for each one.

BRIEF SUMMARY

Systems and techniques disclosed herein may allow for a multichannel waveform synthesis engine. Additional features, advantages, and embodiments of the disclosed subject matter may be set forth or apparent from consideration of the following detailed description, drawings, and claims. Moreover, it is to be understood that both the foregoing summary and the following detailed description are examples and are intended to provide further explanation without limiting the scope of the claims.

A phase counter module may count to a value corresponding to a number of phases available, output a phase counter value indicating a current phase from the number of phases available, and reset the phase counter value when the phase counter value reaches a phase counter reset value. A number of channels may output a waveform. Each of the channels may include a phase module that may to receive the phase counter value output from the phase counter module, and activate an activation signal when the phase counter value indicates a phase assigned to the channel from the number of phases available, and an pulse width module that may receive the activation signal, and when the activation signal is activated, activate a waveform for a period of time indicated by an pulse width assigned to the channel, and deactivate the waveform after the period of time indicated by the pulse width assigned to the channel.

A value indicating number of phases available may be received. A phase counter value of a phase counter and a phase counter reset value based on the value indicating the number of phases available may be set. For each of the number of phases available, any channel with an already active waveform that has not reached the end of a period of time indicated by a pulse width assigned to the channel since the waveform became active may be determined, and the waveform from any such channel may be kept active, any channel including an assigned phase indicated by the phase counter value may be determined, and the waveform from any such channel may be activated, any channel with an already active waveform that has reached the end of a period of time indicated by a pulse width assigned to the channel may be determined, and the waveform from any such channel may be deactivated, and the phase counter value may updated.

A phase counter value may be received at a channel of multichannel waveform synthesis engine. That the phase counter value indicates a phase that was assigned to the channel may be determined. A waveform output from the channel may be activated. The waveform output from the channel may be deactivated after a period of time indicated by a pulse width assigned to the channel has elapsed.

BRIEF DESCRIPTION OF THE DRAWINGS

The accompanying drawings, which are included to provide a further understanding of the disclosed subject matter, are incorporated in and constitute a part of this specification. The drawings also illustrate embodiments of the disclosed subject matter and together with the detailed description serve to explain the principles of embodiments of the disclosed subject matter. No attempt is made to show structural details in more detail than may be necessary for a fundamental understanding of the disclosed subject matter and various ways in which it may be practiced.

DETAILED DESCRIPTION

Figure 1:
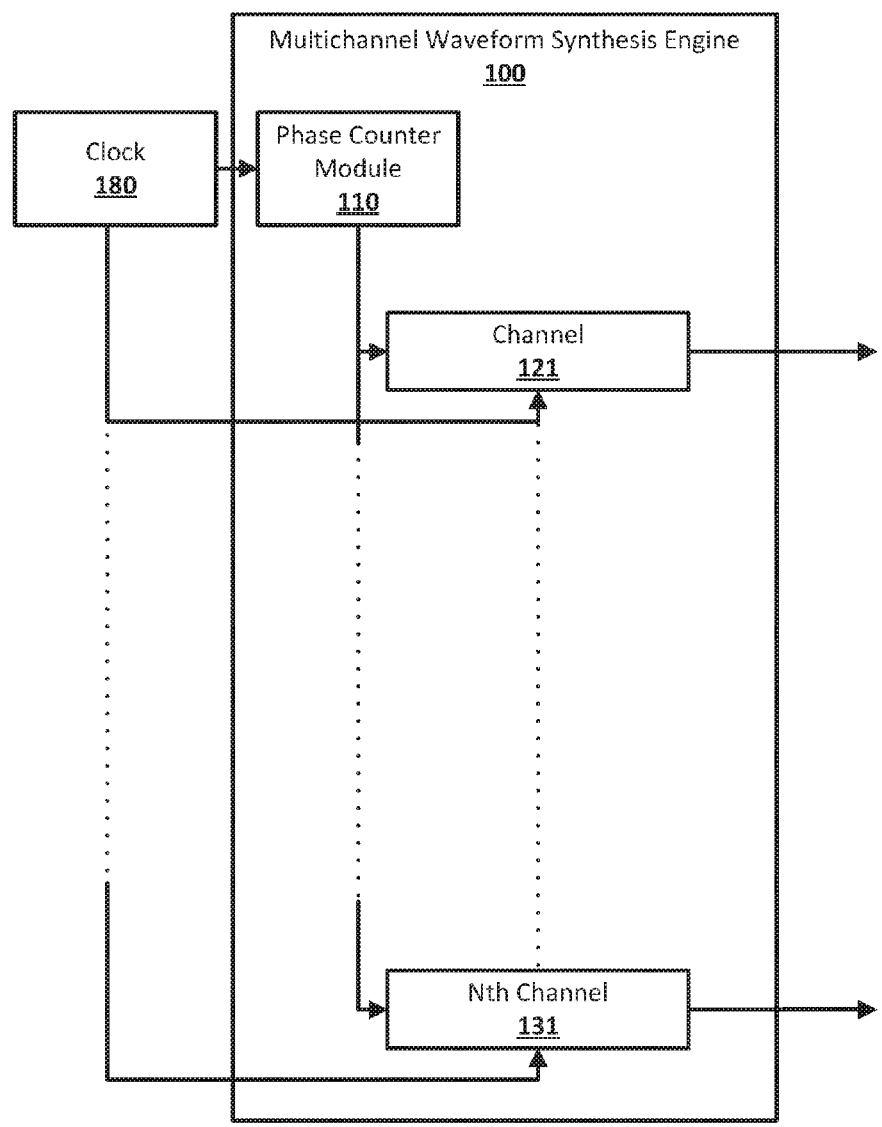
FIG. 1 shows an example system suitable for a multichannel waveform synthesis engine according to an implementation of the disclosed subject matter.

According to embodiments disclosed herein, waveforms may be efficiently generated for a large number of channels.

The waveform for each channel can encode a given phase and pulse width for a signal to be generated for various applications. For example, the waveforms output by the engine can be used in generating signals for transducers arranged in a phased array.

The multichannel waveform synthesis engine may allow for the control of the phase and pulse width of output waveforms. The multichannel waveform synthesis engine may include a phase counter module and a number of channels. The phase counter module may include a phase counter that may be global to all of the channels. The phase counter may count each tick of a clock signal. Each channel may include its own phase module and pulse width module. The phase module of a channel may store, in a phase register, a phase value assigned to the channel. The pulse width module of a channel may store a pulse width assigned to the channel. When the phase value stored by the phase module of a channel matches the current value of the phase counter, a waveform for the channel can be transitioned from low to high. In other words, the match indicates that it's time for that channel to turn on. The length of time that the channel is on can encode the pulse width for the waveform. To set the proper duration of the "on" state for the channel, the match of the phase value stored in the phase module with the global phase counter can reset a pulse width counter for the channel to a start value. The pulse width counter can count each tick of the global clock. The waveform continues in the "on" state until the value of the channel's pulse width counter matches the value in the channel's pulse width register. This match indicates that the waveform has been on long enough, and the waveform is transitioned from high to low. The multichannel waveform synthesis engine can advantageously generate waveforms for a large number of channels, each of which may be efficiently controlled independently, e.g., using a single, global phase counter.

The phase counter may store a phase counter value, which be incremented or decremented by any suitable amount based on any suitable event. For example, the phase counter may count up (e.g., from zero) or down (from any number) to zero by ones, twos, or any other amount, based on receiving the leading or trailing edges of a clock signal. The phase counter value may start at a phase counter start value. The multichannel waveform synthesis engine may also store a phase counter reset value, which may be the value on which the phase counter expires. For example, the phase counter reset value may be stored in the phase counter module.

The number of phases for which the phase counter can count for may be set by the phase counter start value, the phase counter reset value, and the counting increments used by the phase counter. For example, to set the number of phases to eight, the phase counter start value may be set to zero, the counting increment may be set to one, and the phase counter reset value may be set to seven. The phase counter may then count from zero to seven, incrementing the phase counter value from zero to seven by increments of one. Each of the eight separate phase counter values can be output as it is reached. When the phase counter value reaches seven, matching the phase counter reset value, the phase counter may be said to expire and be reset to the phase counter start value. The phase counter start value may its last value (e.g., zero), or it may be changed from its last value. The phase counter reset value may also be changed when the phase counter expires. The phase counter may then begin counting up again. This may allow the phase counter to repeatedly count for the number of phases, for example, eight phases, before resetting.

As another example, to set the number of phases to eight, the phase counter start value may be set to seven, the counting increment may be one, and the phase counter reset value may be set to zero. The phase counter may then count from seven to zero, decrementing the phase counter value from seven to zero by ones, outputting each of the eight separate phase counter values from seven to zero as it is reached. When the phase counter value reaches zero, matching the phase counter reset value, the phase counter may expire, causing the phase counter value to reset to the phase counter start value, which may still be seven, or may have been changed. The phase counter reset value may also be changed when the phase counter expires. The phase counter may then beginning counting down again.

The number of phases the phase counter counts, as determined by the phase counter start value, phase counter reset value, and counting increment, may be used to control the frequency of the output waveforms of the various channels of the multichannel waveform synthesis engine. For example, the number of phases may be used to divide down the frequency of a clock signal used by the phase counter module. To achieve an output frequency for the waveforms of x Hz based on a clock signal of y Hz, the number of phases counted through by the phase counter may be set to y/x. For example, with a clock of 12.75 MHz and a desired output frequency of 75 KHz, the number of phases may be set to 12,7500,000/75,000=170. For example, the phase counter start value may be set to 169 and the phase counter reset value may be set to zero. This may result in the phase counter counting through 170 phases, for example, with the phase counter counting from 169 down to zero. All of the channels that receive the phase counter value from the same phase counter module may output waveforms with the same frequency, based on that phase counter module's phase counter start value, phase counter reset value, and counting increment. In various implementations, the waveforms can be Pulse Width Modulated (PWM) waveforms.

The phase counter may be any suitable hardware or software counter, and may store the phase counter value in any suitable hardware or software register storing any suitable number of bits. For example, the phase counter value may be stored in an 8 or 9 bit hardware or software register. The phase counter reset value may also be stored in any suitable hardware or software register storing any suitable number of bits. The number of bits available to store the phase counter value may determine the minimum frequencies at which the waveforms may be output, as well the number of different frequencies that may be selected from for output. Each number of phases may be associated with a frequency for any given frequency of a clock signal. For example, if the phase counter value is stored in a 9-bit register, this may permit 512 different frequencies, while using an 8-bit register may permit 256 different frequencies.

The multichannel waveform synthesis engine may include any number of channels. Each channel may receive, as input, a phase counter value from the phase counter module and may output a waveform for that channel. The waveform may be, for example, a binary signal, and may be output as either high or low, or may be an analog signal, with certain signal levels corresponding to high and low. A channel may be assigned a phase. When the phase counter counts to the phase assigned to the channel, as represented by a phase value for the channel, the channel may be activated. The channel may transition its waveform from low to high, and may output the waveform in a high state for a period of time determined by a pulse width assigned to the channel. Once the period of time has elapsed, the channel may transition its waveform from high to low and may output the waveform in a low state until the channel is activated again the next time the phase counter counts to the phase assigned to the channel.

A channel of the multichannel waveform synthesis engine may include a phase module and a pulse width module. The phase module of a channel may store the channel's phase value in a register and receive the phase counter value output by the phase counter module. It may determine if the phase counter value matches the phase value associated with the channel, and cause a waveform to be provided in a high state when a match is determined. The pulse width module may store the channel's assigned pulse width, for example, in a pulse width register, and cause the high state of the waveform to persist for the period of time determined by the pulse width assigned to the channel. The waveform may be changed from high to low at the end of the time period.

The phase module of a channel may include a phase comparator and a phase flip-flop for storing a single bit. The phase module may also store a channel phase value which may be associated with the phase assigned to the channel. The phase value may be one less than the number of the phase it is associated with. For example, if there are eight phases available, a phase value of one may be associated with the second phase, which may be phase shifted 45 degrees relative to the first phase with a phase value of zero, while a phase value of seven may be associated with the eighth phase, which may be phase shifted 315 degrees relative to the first phase. Phases may also be numbered starting at zero, in which case the phase value associated with a phase may have the same number as the phase. The output of the phase flip-flop may be an activation signal for the channel, and may start deactivated, for example, low. The phase comparator may output a signal, which may start low, to the phase flip-flop. The phase comparator may receive the phase counter value output by the phase counter module and compare it to the channel phase value. If the phase counter value is not equal to the channel phase value, the output from the phase comparator may remain low, or may transition from high to low, and the phase comparator may wait to receive the next phase counter value from the phase counter module. If the phase counter value is equal to the channel phase value then the output from the phase comparator may transition from low to high.

The phase flip-flop may receive the output signal from the phase comparator, which may be stored in the phase flip-flop at the next clock edge, which may be a leading clock edge. For example, when the output signal from the phase comparator transitions from low to high, the phase flip-flop may store the high signal at the next leading clock edge as long as the signal is still high when the phase flip-flop receives the leading clock edge. The phase flip-flop may then activate the activation signal, for example, transitioning the activation signal from low to high while the phase comparator transitions its output signal from high to low due to a changing of the phase counter value. At the next leading clock edge, the phase flip-flop may store the low signal from the phase comparator and transition the activation signal from high to low. This may result in the activation signal from the phase module being high for one clock cycle, starting one clock cycle after the phase counter value equals the channel phase value. The channel phase value may also be changed when the phase counter value equals the channel value, which may allow the channel to be assigned a different phase.

For example, a phase counter may count for eight phases, and a channel may have a channel phase value of four, which may correspond to the fifth available phase. The output signal from the phase comparator may remain low while the phase counter counts from zero to three, and may transition to high when the phase counter value reaches four. The channel phase value may also be changed, or may kept at four. The high signal from the phase comparator may be received by the phase flip-flop. On the next leading clock edge, the phase flip-flop may store the high signal, before the phase comparator output transitions to low when the same clock edge causes the phase counter value to reach five. The phase flip-flop may transition the activation signal to high. The phase flip-flop may receive the low signal, and on the next leading clock edge, the phase flip-flop may store the low signal from the phase comparator that was caused by the phase counter value reaching five, causing the activation signal to be transitioned to low. The output from the phase comparator, and the activation signal, may remain low until the phase counter value once again matches the channel phase value. In this way, the activation signal for the channel may only transition to high for one clock cycle one time for every pass through all of the phases by the phase counter, unless the channel phase value is changed to a value that the phase counter hasn't reached yet when the output signal from the phase comparator is high.

Each channel may have a channel phase value, which may indicate the phase assigned to that channel. The channel phase value for any channel may be associated with any of the phases available in any suitable manner, for example, being the phase number minus one, based on the phase counter start value, phase counter reset value, and counter increment. For example, if there are 512 phases available, from one to 512, any channel may have any channel phase value from zero to 511, and channels do not need to have unique phase values relative to the other channels. This may allow each channel to have its phase assigned and changed independently of the other channels, allowing for control of the phase differences between channels through channel phase values. For example, with eight phases available, a first channel may have a channel phase value of zero, and a second channel may have a channel phase value of four, corresponding to the first and fifth of the available phases. The waveforms output by the second channel and the first channel may have a phase difference of 180 degrees. The ordering of the channel phase values may be based on whether the phase counter counts up or down. For example, if the phase counter counts up, channel phase values may be in ascending order, and if the phase counter counts down, channel phase values may be in descending order. The channel phase value, and phase, of any channel may be changed at every cycle of the waveform, allowing for phase adjustments as frequent as the frequency of the waveform as determined by the clock signal and the number of phases available.

The channel phase value may be stored in any suitable hardware or software register storing any suitable number of bits. The number of bits used to store the channel phase value may be the same number of bits used to store the phase counter value, to ensure that any phase may be assigned to a channel. The phase comparator may be any suitable hardware or software comparator, implemented in any suitable manner and with any suitable capabilities. For example, the comparator may be able to perform equal to, greater than, and less than comparisons, or may only be able to compare two values to determine if they are equal. The phase flip-flop may be any suitable flip-flop for storing one bit of information. The phase flip-flop may be asynchronous, or may be synchronous and activated by leading or trailing clock edges, and may store an input signal with any suitable delay. For example, the phase flip-flop may have a very short delay, to ensure the storage of a received high signal before the high signal transitions to low on the same clock edge that triggers the storage by the phase flip-flop. The phase flip-flop may also be replaced by any other suitable component for transitioning the activation signal between high and low in the appropriate circumstances. The activation signal may also be transitioned by the phase comparator, without a flip-flop, latch, or other such component. The phase module may output the activation signal directly from the phase comparator.

The pulse width module of a channel may include a pulse width counter which may store and increment or decrement a pulse width counter value, a first pulse width comparator, a second pulse width comparator, and a pulse width flip-flop for storing a single bit. The pulse width module may also include a register that stores a zero value and a channel pulse width value which may indicate the pulse width assigned to the channel. The first pulse width comparator may output a high signal when the pulse width counter value is equal to the channel pulse width value and a low signal otherwise, and the second pulse width comparator may output a high signal when the channel pulse width value is equal to zero, and a low signal otherwise. The output of the pulse width flip-flop may be the waveform for the channel, and may start low. The pulse width flip-flop may store a signal that may be high when either the waveform output from the pulse width flip-flop is high or the activation signal from the phase module of the channel is high, and neither the first comparator nor the second comparator is outputting a high signal, and may be low otherwise.

The pulse width module may receive the high activation signal from the phase module, for example, from the phase flip-flop or phase comparator, when, or, for example, one clock edge after, the channel phase value is matched by the phase counter value. The high activation signal may cause the pulse width counter to reset, for example, setting the pulse width counter value to zero, and may allow the channel pulse width value to be changed. The high activation signal and the resetting of the pulse width counter may cause the signal received by the pulse width flip-flop of the pulse width module to transition to high. The pulse width flip-flop may store the high signal on the next leading clock edge, which may cause the waveform output from the flip-flop to transition to high so long as the channel pulse width value is not zero.

The pulse width counter may begin counting, for example, starting with the reset pulse width counter value of zero and incrementing the pulse width counter value on each leading clock edge of a clock signal. The clock signal may be the same clock signal used by the phase counter in the phase counter module. The waveform output from the pulse width flip-flop may remain high after the activation signal from the phase module transitions from high to low for as long as it takes from the pulse width counter to count to the channel pulse width value. Once the pulse width counter is equal to the channel pulse width value, indicating that the pulse width counter has expired, the signal from the first pulse width comparator may transition from low to high, causing the signal received by the pulse width flip-flop to transition from high to low. The pulse width flip-flop may store the low signal on the next leading clock edge, causing the output waveform to transition to from high to low. This may result in the output waveform having a pulse width equal to the assigned pulse width for the channel as indicated by the channel pulse width value. The pulse width counter may continue to count after the output waveform has transitioned to low, which may cause the first pulse width comparator to transition back to low. This may not result in the waveform transitioning back to high, as a low waveform may only transition to high when the activation signal is high. The waveform may remain low until the activation signal transitions back to high, for example, the next time the channel phase value matches the phase counter value.

For example, a channel may have an assigned pulse width of four, indicated by a channel pulse width value of four. When the activation signal transitions to high the pulse width counter for the channel may reset to zero, which may cause the first pulse width comparator to transition to low. Combined with the activation signal, the low signal from the first pulse width comparator may cause the signal received by the pulse width flip-flop to transition to high. On the next leading clock edge, the pulse width flip-flop may store the high signal, and may transition the output waveform to high. The pulse width counter may increment the pulse width counter value from zero to one. This clock edge may be the start of the first clock cycle for which the output waveform is high. The next leading clock edge may mark the end of the first clock cycle for which the output waveform is high, and the beginning of the second clock cycle for which the output waveform is high. The pulse width counter value may be incremented to two. The next leading clock edge may mark the end of the second clock cycle for which the output waveform is high, and the beginning of the third clock cycle for which the output waveform is high. The pulse width counter value may be incremented to three.

The next leading clock edge may mark the end of the third clock cycle for which the output waveform is high, and the beginning of the fourth clock cycle for which the output waveform is high. The pulse width counter value may be incremented to four, expiring the pulse width counter. This may cause the first pulse width comparator to transition from low to high, and the signal received by the pulse width flip-flop to transition from high to low. Because the pulse width flip-flop may not store the received low signal until the next leading clock edge, the output waveform may remain high for the clock cycle until the next leading clock edge, even while the signal being received by the pulse width flip-flop is low. This may be the fourth clock cycle for which the output waveform is high. On the next leading clock edge, the pulse width flip-flop may store the low signal, and the output waveform may transition to low. The waveform may have remained high for four clock cycles after being activated, matching the channel pulse width value. In this way, the width of the high signal for the output waveform from any channel may be controlled using the channel pulse width value. The channel pulse width value may only be limited by the number of phases available, as the channel pulse width value may not be larger than the number of phases.

A pulse width module may use other suitable configurations for outputting the waveform from a channel based on an activation signal and a channel pulse width value. For example, a pulse width module may not include the second pulse width comparator. This may reduce the complexity of the pulse width module, and may allow the pulse width counter to count up or down. To allow the pulse width counter to count down, the channel pulse width value may be stored in the pulse width counter whenever the pulse width counter is reset, and the pulse width module may store zeros where the channel pulse width value would have been stored. The first pulse width comparator may then compare the pulse width counter to the zeros, as the pulse width counter may count down from the channel pulse width value to zero before a high waveform is transitioned to low.

As another example, a pulse width module may include a pulse width latch instead of a pulse width flip-flop. The pulse width latch may also store one bit, but may be asynchronous. For example, the pulse width latch may be a Set-Reset (SR) latch. The Set input of the pulse width latch may be connected directly to the activation signal from the phase module. When the activation signal transitions from low to high, this may set the pulse width latch, which may, for example, store a one, and cause the pulse width latch to transition the output waveform from low to high. The pulse width counter may also be reset, and may begin counting, for example, from zero up to the channel pulse width value. The activation signal may transition to low on the next leading clock edge following its transition from low to high, but the pulse width latch may continue to output the waveform as high while storing a one. When the pulse width counter value is equal to the channel pulse width value, the first pulse width comparator may transition its output signal from low to high. This may cause the input to the Reset input of the pulse width latch to transition from low to high, resulting in the pulse width latch storing a zero and transitioning the output waveform to low. Because the pulse width latch may be asynchronous, the transitions of the output waveform may not be delayed by any clock cycles. The output waveform may transition to high during the same clock cycle that the activation signal transitions to high, and may transition to low the same clock cycle that the pulse width counter value equals the channel pulse width value. The output waveform from the pulse width module may also be output without either a flip-flop or a latch. For example, the output waveform may be output directly from a logical AND gate which receives, as inputs, the output from a logical OR gate that receives the output waveform and the activation signal, and another logical OR gates that receives the outputs from the first and second pulse width comparators.

Each channel in a multichannel waveform synthesis engine may have a channel pulse width value, which may be the pulse width assigned to that channel. The channel pulse width value for any channel in a multichannel waveform synthesis engine may be any value from zero the number of phases available, based on the phase counter start value, phase counter reset value, and counter increment. For example, if there are 512 phases available, one to 512, any channel of the multichannel waveform synthesis engine may have any channel pulse width value from zero to 512. This may allow each channel to have its pulse width assigned and changed independently of the other channels, allowing for control of the pulse widths of each through channel pulse width values. For example, with eight phases available, a first channel may have a channel pulse width value of four, and a second channel may have a channel pulse width value of eight. The waveform output by the first channel may have a width of four, or 50% duty cycle, while the waveform output by the second channel may have a width of eight, or a 100% duty cycle. The channel pulse width value, and pulse width, of any channel may be changed at the beginning of every cycle of the output waveform, allowing for pulse width adjustments as frequent as the frequency of the waveform as determined by the clock signal and the number of phases available.

The pulse width counter may be any suitable hardware or software counter, and may store the pulse width counter value in any suitable hardware or software register storing any suitable number of bits. For example, the pulse width counter value may be stored in 7-bit hardware or software register. The number of bits used to the store pulse width counter value may also be based on the number of bits used to store the phase counter value. For example, the phase counter value may be stored using one or two more bits than are used to store the pulse width counter value. The channel pulse width value may also be stored in any suitable hardware or software register storing any suitable number of bits. The number of bits used to store the channel pulse width value may be the same number of bits used to store the pulse width counter value, to ensure that any pulse width counter may always be able to count to the channel pulse width value. The first pulse width comparator and the second pulse width comparator may be any suitable hardware or software comparators, implemented in any suitable manner and with any suitable capabilities. For example, the comparator may be able to perform equal to, greater than, and less than comparisons, or may only be able to compare two values to determine if they are equal. The pulse width flip-flop may be any suitable flip-flop for storing one bit of information. The pulse width flip-flop may be asynchronous, or may be synchronous and activated by leading or trailing clock edges, and may store an input signal with any suitable delay. For example, the pulse width flip-flop may have a very short delay, to ensure the storage of a high signal before the high signal transitions to low on the same clock edge that triggers the storage by the pulse width flip-flop. The pulse width flip-flop may also be replaced by any other suitable component for transitioning the activation signal between high and low in the appropriate circumstances, such as, for example, an SR latch. Various signals in the pulse width module may be combined through the use of any suitable hardware or software logic gates, such as AND, OR, and NOT gates.

The multichannel waveform synthesis engine may be implemented using any suitable combination of hardware and software. For example, components of the multichannel waveform synthesis engine may be implemented in whole or in part as a field programmable gate array (FPGA) or application-specific integrated circuit (ASIC) or complex programmable logic device (CPLD), or as software running on any suitable processing device. The waveforms output by the multichannel waveform synthesis engine may be output on hardware, or may be software outputs used for control of other software or of hardware. The number of phases available, channel phase values for each channel, and channel pulse width values for each channel, may be determined and assigned in any suitable manner. For example, a software or hardware controller that is part of, or separate from, the multichannel waveform synthesis engine may determine and assign any or all of the phase counter start value, phase counter reset value, channel phase values, and channel pulse width values. The multichannel waveform synthesis engine may receive a clock signal from any suitable hardware or software clock or oscillator.

FIG. 1 shows an example system suitable for a multichannel waveform synthesis engine according to an implementation of the disclosed subject matter. A multichannel waveform synthesis engine 100 may include a phase counter module 110, a channel 121, and an Nth channel 131, with any number of channels in between the channel 121 and the Nth channel 131. The phase counter module 110, the channel 121, the Nth channel 131, and channels in-between, may receive a clock signal from a clock 180.

The phase counter module 110 may be any suitable module for counting through phases, and resetting after the count has reached the desired angle. The phase counter module 110 may count by increments of one, for example, on each edge of the clock signal received from the clock 180.

The phase counter module 110 may output the current phase counter value to the channel 121, the Nth channel 131, and any channels in-between.

The channel 121, the Nth channel 131, and any channels in-between may each be independent channels for outputting a waveform. Each of the channel 121, the Nth channel 131, and the channels in-between may output its own waveform based on the phase counter value received from the phase counter module 110 and the clock signal received from the clock 180. Each of the channel 121, the Nth channel 131, and the channels in-between may be assigned a phase and a pulse width, and may output a waveform in a high state for a period of time determined by their respective pulse widths when the phase counter has reached a value associated with their respective assigned phases.

Figure 2:
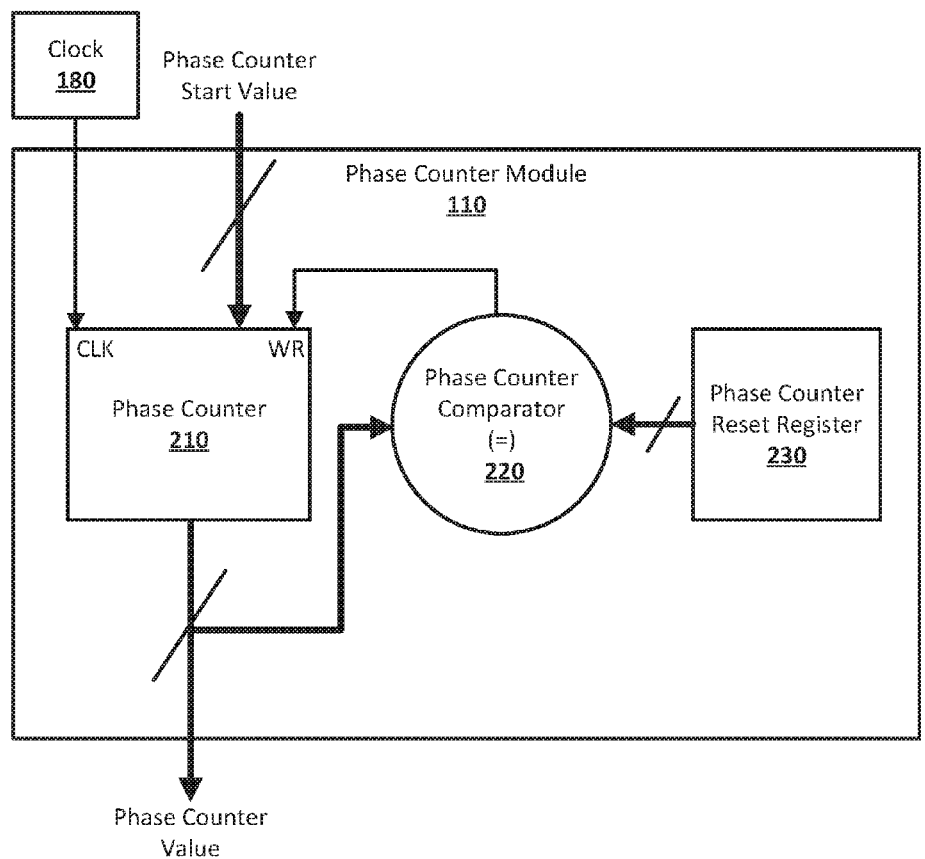
FIG. 2 shows an example system suitable for multichannel waveform synthesis engine according to an implementation of the disclosed subject matter.

FIG. 2 shows an example system suitable for a multichannel waveform synthesis engine according to an implementation of the disclosed subject matter. The phase counter module 110 may include a phase counter 210, a phase counter comparator 220, and a phase counter reset register 230. The phase counter 210 may be any suitable hardware or software counter, and may store a phase counter value in any suitable hardware or software register, storing any suitable number of bits. For example, the phase counter value may be stored in a 9-bit register of the phase counter 210. The phase counter 210 may include a CLK input, which may receive a clock signal, for example, from the clock 180, and a WR input, which may enable the writing of a new value, for example, the phase counter start value, to the register storing the phase counter value. The WR input may be active high or active low, depending on the nature of the output from the phase counter comparator 220. The phase counter 210 may be able to increment or decrement the phase counter value by some counting increment on the occurrence of some specified event. For example, the phase counter 210 may decrement the phase counter value by one each time the phase counter 210 receives the leading, or positive, or rising, edge of a clock signal from the clock 180. The phase counter 210 may also increment or decrement the phase counter value on the trailing, or negative, or falling, edge of the clock signal. The phase counter 210 may output the value of the phase counter value, both out of the phase counter module 110, and to the phase counter comparator 220. For example, the bits of the register storing the phase counter value may be output in parallel.

The phase counter comparator 220 may be any suitable hardware or software comparator for comparing input values, for example, determining if two input values are equal. For example, the phase counter comparator 220 may be implemented using a number of hardware XOR and OR gates. The phase counter comparator 220 may receive input values of any bit length, and may receive inputs in parallel. The phase counter comparator 220 may able to output a signal indicating whether two received values are equal. For example, the phase counter comparator 220 may output a high signal if received values are equal, and a low signal if received values are not equal, or vice versa.

The phase counter reset register 230 may store a phase counter reset value in any suitable hardware or software register, storing any suitable number of bits. For example, the phase counter reset value may be stored in the same type of register, for example, a 9-bit register, that is used by the phase counter 210. The phase counter reset value may be the value the phase counter value reaches before resetting to the phase counter start value. The phase counter reset register 230 may output the phase counter reset value to the phase counter comparator 220.

The number of phases available for and the frequency of channels, for example, the channel 121, the Nth channel 131, and any channels in-between, of the multichannel waveform synthesis engine 100 may be determined by setting the phase counter start value and the phase counter reset value, and by the counting increment of the phase counter 210. For example, if the phase counter 210 counts by ones the number of phases available may be one more than the difference between the phase counter start value and the phase counter reset value. For example, if the phase counter 210 increments the phase counter value, a phase counter start value of zero and a phase counter reset value of 511 may allow for 512 phases. If the phase counter 210 decrements the phase counter value, a phase counter start value of 511 and a phase counter reset value of zero may allow for 512 phases. The frequency of all of the channels of the multichannel waveform synthesis engine 100 may be determined by dividing down a frequency, for example, from the clock 180, by the number of available phases. For example, if the clock 180 runs at 12.75 MHZ, the output waveforms may be set to a frequency of 75 KHz by setting the number of available phases to 170.

The phase counter 210 may start with the phase counter start value in its register as the phase counter value, and the phase counter reset register 220 may start with the phase counter reset value. When the clock 180 is running, the phase counter 210 may output the current phase counter value, both outside the phase counter module 110 and to the phase counter comparator 220. The phase counter comparator 220 may also receive the phase counter reset value from the phase counter reset register 230. If the phase counter value is equal to the phase counter reset value, the phase counter comparator 220 may output a signal, for example, a high signal, which may be input to the WR input of the phase counter 210, enabling the writing of a new value to the register of the phase counter 210. The new value may be the phase counter start value, which may be the same as an original phase counter start value, or may have been changed, for example, to change the number of phases available or change the frequency of the output waveforms. If the phase counter value is not equal to the phase counter reset value, the phase counter comparator 210 may output a signal, for example, a low signal, that does not enable the writing of a new value to the register of the phase counter 210. The phase counter 210 may receive the next leading edge of the clock 180, decrement the phase counter value by one, and output the phase counter value, leading to another comparison by the phase counter comparator 220, and so on until the clock 180 stops. This may cause the phase counter 210 to count for each available phase, outputting phase counter values corresponding to each such phase in sequence on a loop while the clock 180 is running In some implementations, the phase counter 210 may increment the phase counter value by one, or may increment or decrement the phase counter value by some other counting increment, and may count on trailing clock edges. For an incrementing phase counter 210, the phase counter 210 may have the phase counter value reset to zero when the WR input is enabled by the phase counter comparator 220, and the phase counter reset register 230 may have a WR input which may allow the writing of a new value as the phase counter reset value when enabled by the phase counter comparator 220.

Figure 3:
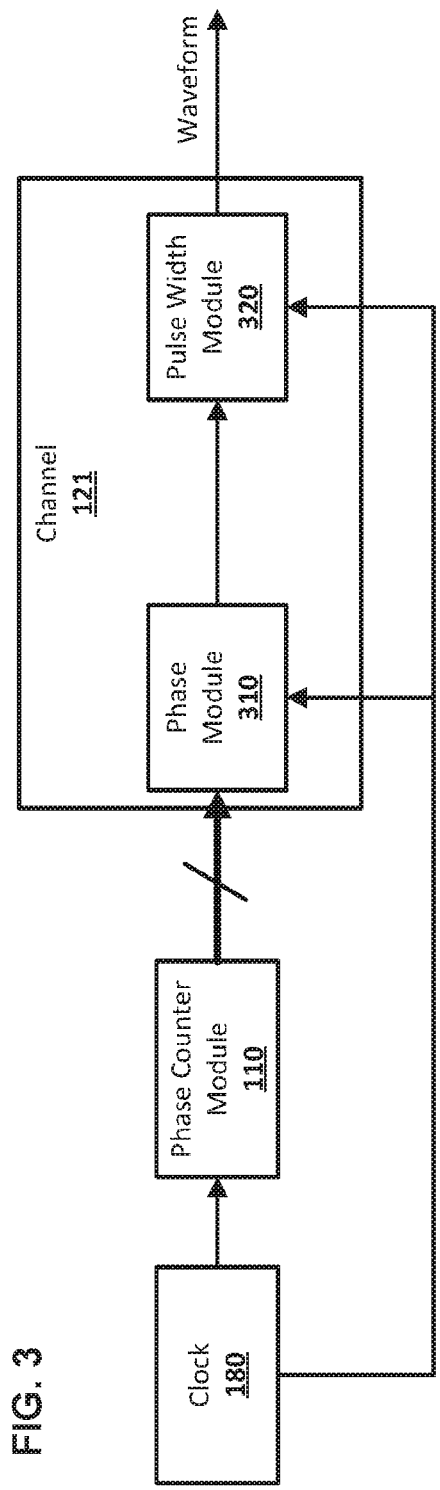
FIG. 3 shows an example system suitable for a multichannel waveform synthesis engine according to an implementation of the disclosed subject matter.

FIG. 3 shows an example system suitable for a multichannel waveform synthesis engine according to an implementation of the disclosed subject matter. Each channel of the multichannel waveform synthesis engine 100, such as the channel 121, may include a phase module 310 and a pulse width module 320, and may output a waveform. The phase module 310 may receive phase counter values output by the phase counter module 110, and may send an activation signal to the pulse width module 320. The pulse width module 320 may output the waveform, and may determine the width of the waveform. The phase module 310 and the pulse width module 320 may receive the clock signal from the clock 180.

Figure 4:
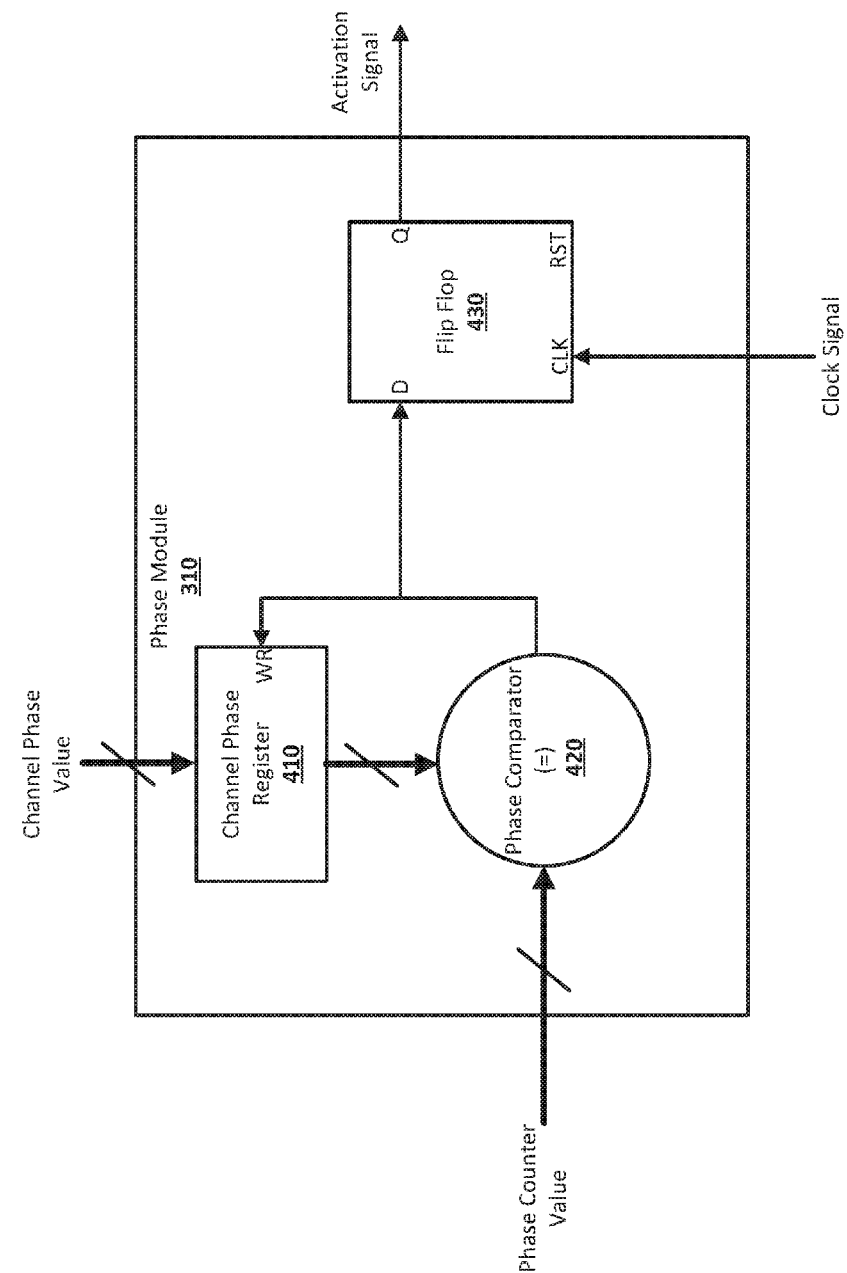
FIG. 4 shows an example system suitable for a multichannel waveform synthesis engine according to an implementation of the disclosed subject matter.

FIG. 4 shows an example system suitable for a multichannel waveform synthesis engine according to an implementation of the disclosed subject matter. The phase module 310 of a channel, such as the channel 121, the Nth channel 131, or any channel in-between, of the multichannel waveform synthesis engine 100, may include a channel phase register 410, a phase comparator 420, and a flip-flop 430. The channel phase register 410 may store a channel phase value in any suitable hardware or software register, storing any suitable number of bits. For example, the channel phase register may be the same type of register, for example, a 9-bit register, that is used by the phase counter 210. The channel phase value may be the phase counter value that will cause the phase module 310 to output an activation signal, activating the channel, and may be associated with the phase assigned to the channel. The channel phase register 410 may include a WR input, which may enable the writing of a new value, for example, a new channel phase value, to the channel phase register 410. The WR input may be active high or active low. The channel phase register 230 may output the channel phase value to the phase comparator 420.

The phase comparator 420 may be any suitable hardware or software comparator for comparing input values, for example, determining if two input values are equal. For example, the phase comparator 420 may be implemented using a number of hardware XOR and OR gates. The phase comparator 420 may receive input values of any bit length, and may receive inputs in parallel. The phase comparator 420 may able to output a signal indicating whether two received values are equal. For example, the phase comparator 420 may output a high signal if received values are equal, and a low signal if received values are not equal, or vice versa.

The flip-flop 430 may be any suitable hardware or software flip-flop for storing one bit and outputting a signal based on the stored bit. The flip-flop 430 may include a CLK input, a D input, a Q output, and RST input. The CLK input may be able to receive a clock signal, for example, from the clock 180. The D input may be able to receive a signal indicating the bit that the flip-flop 430 may store. For example, if the D input is high when the flip-flop 430 receives a clock edge of the clock signal input to the CLK input, the flip-flop 430 may store a one on that clock edge. If the D input is low when the flip-flop 430 receives a clock edge of the clock signal input to the CLK input, the flip-flop 430 may store a zero on that next clock edge. The Q output may be able to output a signal based on the bit currently stored by the flip-flop 430. For example, if the flip-flop 430 is storing a one, the signal output from Q may be high, and if the flip-flop 430 is storing a zero, the signal output from Q may be low. The signal from the Q output may be the activation signal for the pulse width module 320. The RST input of the flip-flop 430 may be used to reset the bit stored by the flip-flop 430 to zero, regardless of the value of the D input.

The channel phase value assigned to a channel, and stored in the channel phase register 410 for the channel, may be used to assign a phase to the channel. A channel phase value may be associated with a phase from the available phases. The order in which channels may activate based on their channel phase value after a reset of the phase counter 210 may be based on whether the phase counter 210 counts up or down. For example, if the phase counter 210 counts up, channels may be activated in ascending order of their channel phase values, and if the phase counter 210 counts down, channels may activate in descending order of their channel phase values. The channel phase values may determine the phase differences of the output waveforms, such as the channel 121 and the Nth channel 131, based on the association between the channel phase values and the available phases. For example, there may be eight available phases, the channel 121 may be have a channel phase value of zero associated with the first phase, and the Nth channel 131 may have a channel phase value of seven associated with the eighth phase. The phase difference between the output waveforms of the channel 121 and the Nth channel 131 may be 315 degrees. If the phase counter 210 counts up, this may allow the output waveform from the channel 121 to be ahead of the output waveform from the Nth channel 131 by 315 degrees. If the phase counter 210 counts down, the output waveform from the Nth channel 131 may be ahead of the output waveform from the channel 121 by 315 degrees.

The phase comparator 420 of a channel, such as the channel 121, may receive the phase counter value output from the phase counter module 110 by the phase counter 210 and the channel phase value stored in the channel phase register 410. If the channel phase value is equal to the phase counter value, the phase comparator 420 may output a signal, for example, a high signal. This may indicate that the phase counter 210 has counted to the phase for the channel. The high signal from the phase comparator 420 may be received by the WR input of the channel phase register 410, enabling the writing of a new channel phase value to the channel phase register 410. The new channel phase value may be the same as or different from the channel phase value already stored in the channel phase register 410. The high signal from the phase comparator 420 may also be received by the D input of the flip-flop 430. The flip-flop 430 may also receive a clock signal, for example, from the clock 180. The flip-flop 430 may receive the high signal on the D input, and on the next clock edge, for example, leading edge, of the clock signal, the flip-flop 430 may store a one, before the signal from the phase comparator 420 to the D input transitions back to low due to a change in the phase counter value received from the phase counter 210 by the phase comparator 420. This may cause the activation signal on the Q output to transition to high. While the flip-flop 430 stores a one the activation signal from the Q output may remain high.

If the channel phase value is not equal to the phase counter value, the phase comparator 420 may output a signal, for example, a low signal, indicating that the values being compared by the phase comparator 420 are not equal. The low signal from the phase comparator 420 may be received by the D input of the flip-flop 430. The flip-flop 430 may also receive a clock signal, for example, from the clock 180. The flip-flop 430 may receive the low signal on the D input, and on the next clock edge, for example, leading edge, of the clock signal, the flip-flop 430 may store a zero, before the signal from the phase comparator 420 to the D input transitions to high if the phase counter value has changed to match the channel phase value. This may cause the activation signal on the Q output to transition to low if it was high, or to remain low. While the flip-flop 430 stores a zero the activation signal from the Q output may remain low. This may result in the activation signal from the phase module 310 for a channel, such as the channel 121, the Nth channel 131, or any channel in-between, being high for one clock cycle, one clock cycle after the phase counter 210 has counted to the phase assigned to the channel, as determined by the phase counter value and the channel phase value.

For example, the channel 121 may have an assigned phase of six out of eight available phases. The channel phase value stored in the channel phase register 410 may be five. The phase counter 210 may count down, starting with a phase counter start value of seven and counting down to zero. The flip-flop 430 may store a zero as a default value, and the activation signal from the Q output may be low. The phase comparator 420 may receive the first phase counter value of seven, which may not be equal to the channel phase value of five. The phase comparator 420 may output a low signal, which may be received by the flip-flop 430. On the next leading clock edge, the phase counter 210 may count down by one and output a phase counter value of six. The flip-flop 430 may store the low signal, which may not change, and continue to store a zero. The activation signal may remain low. The phase comparator 420 may determine that the phase counter value of six does not match the channel phase value of five and may output a low signal to the D input of the flip-flop 430. The flip-flop 430 may receive the low signal.

On the next leading clock edge, the phase counter may count down by one and output a phase counter value of five. The flip-flop 430 may store the low signal from the phase comparator 420 before the low signal changes, continuing to store a zero. The activation signal may remain low. The phase comparator 420 may determine that the phase counter value of five matches the channel phase value of five, and may output a high signal to the D input of the flip-flop 430 and the WR input of the channel phase register 410. The flip-flop 430 may receive the high signal on the D input, after having stored the previously received low signal. A new channel phase value may be written to the channel phase register 410. The new channel phase value may be the same as the channel phase value stored in the channel phase register, for example, five, or may be a different channel phase value associated with a different one of the eight available phases.

On the next leading clock edge, the phase counter may count down by one and output a phase counter value of four. The flip-flop 430 may store the high signal output by the phase comparator 420 before the high signal changes, storing a one. The activation signal may transition to high. The phase comparator 420 may determine that the phase counter value of four does not match the channel phase value of five and may output a low signal to the D input of the flip-flop 430. The flip-flop 430 may receive the low signal after having stored the previously received high signal.

On the next leading clock edge, the phase counter may count down by one and output a phase counter value of three. The flip-flop 430 may store the low signal from the phase comparator 420, which may not change, and store a zero. The activation signal, which may have been high for one clock cycle, may transition to low. The phase comparator 420 may determine that the phase counter value of three does not match the channel phase value of five and may output a low signal to the D input of the flip-flop 430. The flip-flop 430 may receive the low signal. This may repeat as the phase counter 210 counts down through phase counter values of two, one, and zero, before the phase counter value is reset, for example, back to seven, and the phase counter 210 begins counting down again. The activation signal from the phase module 310 of the channel 121 may thus be high for one clock cycle, starting one cycle after the phase counter value reaches five, the channel phase value of the channel 121, and be low for other clock cycles.

Figure 5:
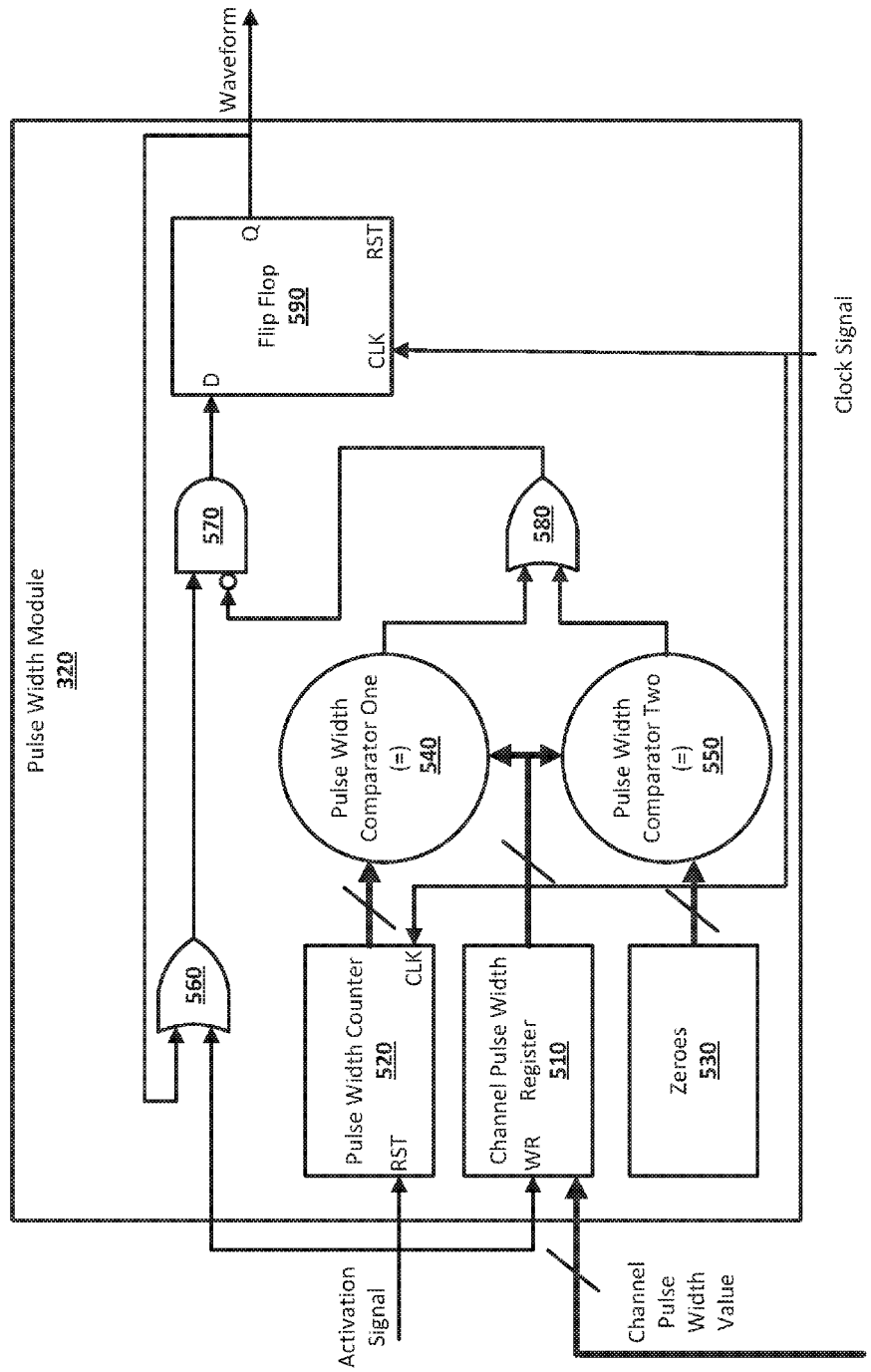
FIG. 5 shows an example system suitable for a multichannel waveform synthesis engine according to an implementation of the disclosed subject matter.

FIG. 5 shows an example system suitable for a multi-channel waveform synthesis engine according to an implementation of the disclosed subject matter. The pulse width module 320 of a channel, such as the channel 121, the Nth channel 131, or any channel in-between, of the multichannel waveform synthesis engine 100, may include a channel pulse width register 510, an pulse width counter 520, zeroes 520, pulse width comparator one 540, pulse width comparator two 550, OR gates 560, AND gate 570, OR gate 580, and flip-flop 590. The pulse width counter 520 may be any suitable hardware or software counter, and may store a pulse width counter value in any suitable hardware or software register, storing any suitable number of bits. For example, the pulse width counter value may be stored in a 7-bit register of the pulse width counter 520. The pulse width counter 520 may include a CLK input, which may receive a clock signal, for example, from the clock 180, and a RST input, which may enable the resetting the pulse width counter value to zero. The RST input may be active high or active low, depending on the nature of the activation signal output from the phase module 310. The pulse width counter 520 may be able to increment or decrement the pulse width counter value by some counting increment on the occurrence of some specified event. For example, pulse width counter 520 may increment the pulse width counter value by one each time the pulse width counter 520 receives the leading edge of a clock signal from the clock 180. The pulse width counter 520 may also increment or decrement the pulse width counter value on the trailing edge of the clock signal. The pulse width counter 520 may output the value of the pulse width counter value. For example, the bits of the register storing the pulse width counter value may be output in parallel. The pulse width counter value may be output to, for example, the pulse width comparator one 550.

The channel pulse width register 510 may store a channel pulse width value in any suitable hardware or software register, storing any suitable number of bits. For example, the channel pulse width register may be the same type of register, for example, a 7-bit register, that is used by the pulse width counter 520. The channel pulse width value for a channel may indicate the pulse width of the waveform output by the channel, as reflected by the width or duty cycle of the output waveform. The channel pulse width register 520 may include a WR input, which may enable the writing of a new value, for example, a new channel pulse width value, to channel pulse width register 520. The WR input may be active high or active low. The channel pulse width register 520 may output the channel pulse width value to the pulse width comparator one 540 and the pulse width comparator two 550.

The pulse width comparator one 550 and the pulse width comparator two 560 may each be any suitable hardware or software comparator for comparing input values, for example, determining if two input values are equal. For example, the pulse width comparator one 550 and the pulse width comparator two 560 may each be implemented using a number of hardware XOR and OR gates. The pulse width comparator one 550 and the pulse width comparator two 560 may each receive input values of any bit length, and may receive inputs in parallel. The pulse width comparator one 550 and the pulse width comparator two 560 may each able to output a signal indicating whether two received values are equal. For example, the pulse width comparator one 550 and the pulse width comparator two 560 may each output a high signal if received values are equal, and a low signal if received values are not equal, or vice versa.

The flip-flip 590 may be any suitable hardware or software flip-flop for storing one bit and outputting a signal based on the stored bit. The flip-flop 590 may include a CLK input, a D input, a Q output, and RST input. The CLK input may be able to receive a clock signal, for example, from the clock 180. The D input may be able to receive a signal indicating the bit that the flip-flop 590 may store. For example, if the D input is high when the flip-flop 590 receives a clock edge of the clock signal input to the CLK input, the flip-flop 590 may store a one on that clock edge. If the D input is low when the flip-flop 590 receives a clock edge of the clock signal input to the CLK input, the flip-flop 590 may store a zero on that next clock edge. The Q output may be able to output a signal based on the bit currently stored by the flip-flop 590. For example, if the flip-flop 590 is storing a one, the signal output from Q may be high, and if the flip-flop 590 is storing a zero, the signal output from Q may be low. The signal from the Q output may be the waveform for the channel, for example, the channel 121. The RST input of the flip-flop 590 may be used to reset the bit stored by the flip-flop 590 to zero, regardless of the value of the D input.

The OR gate 560, AND gate 570, and OR gate 580 may be any suitable hardware or software implementations of logic gates. For example, the OR gate 560 and OR gate 580 may be hardware logical OR gates, or may be software implemented logical ORs. The AND gate 570 may be a hardware logical AND gate, or may be a software implemented logical AND.

The width (duration) of a waveform output by a channel, for example, the channel 121, the Nth channel 131, and any channels in-between, of the multichannel waveform synthesis engine 100 may be determined by setting the channel's pulse width counter value, channel pulse width value, and by the counting increment of the pulse width counter 520. For example, if the pulse width counter 520 of the channel 121 counts by ones, the pulse width of the waveform output by the channel 121 may be the difference between the reset value of the pulse width counter 520 and the channel pulse width value stored in the channel pulse width register 510. For example, if the pulse width counter 520 increments the pulse width counter value, a reset value for the pulse width counter 520 of zero and a channel pulse width value of four may result in the output waveform from the channel 121 having a pulse width of four. If the pulse width counter 520 decrements the pulse width counter value, a reset value for the pulse width counter 520 of four and a channel pulse width value of zero may result in the output waveform from the channel 121 having a pulse width of four. Each channel of the multichannel waveform synthesis engine 100 may have its own, independent, pulse width, with an independent channel pulse width value and reset value for the channel's pulse width counter 520. This may allow the pulse width of the output waveforms from each channel to be controlled independently.

The pulse width counter 520, the channel pulse width register 510, and the OR gate 560 of a pulse width module 320 for a channel, for example, the channel 121, may all receive the activation signal, for example, output by the phase module 310 of the channel. The activation signal may be low. The flip-flop 590 may store a zero as a default, resulting in the waveform output from Q being low. When the activation signal transitions to high, the RST input on the pulse width counter 520 and the WR input on the channel pulse width register 510 may be enabled and the OR gate 560 may output a high signal. Enabling the RST input may result in the pulse width counter 520, which may have been counting every leading edge of the clock signal, for example, from the clock 180, resetting the pulse width counter value to zero. Enabling the WR input may result in the channel pulse width register 510 storing an input channel pulse width value, which may be the same as a channel pulse width value already stored in the channel pulse width register 510, or may be a different value. This may allow for the pulse width of the channel's output waveform to be changed as frequently as the frequency of the output waveform, and right before the waveform transitions to high. The high signal output from the OR gate 560 may be input to the AND gate 570. The AND gate 570 may also receive an inverted signal from the OR gate 580.

While the activation signal is high, the pulse width comparator one 540 may compare the pulse width counter value, which may have been reset to zero, to the channel pulse width value that may have just been written to the channel pulse width register 510. The pulse width comparator two 550 may compare the channel pulse width value that may have just been written to the channel pulse width 510 to zeroes 530, which may be stored in any suitable hard or software register of the same bit width as the channel pulse width register 510. If the channel pulse width value is zero, the pulse width comparator two 550 may output a high signal, which may cause the OR gate 580 to output a high signal that may be inverted to a low signal before arriving at the AND gate 570. This may cause the AND gate 570 to output a low signal, causing the flip-flop 590 to receive the low signal and continue to store a zero on the next leading clock edge, preventing the waveform from going high, even when the pulse width counter 520 has counted up and caused the pulse width comparator one 540 to output a low signal. Thus, setting the channel pulse width value of a channel to zero may disable the output waveform from the channel, as it may never transition to high. Otherwise, if the channel pulse width value is not zero, the pulse width comparator two 550 may output a low signal, and while the activation signal is high, the pulse width comparator one 540 may also output a low signal. This may cause the OR gate 580 to output a low signal that may be inverted to a high signal before entering the AND gate 570. Since the OR gate 560 may also be outputting a high signal, the AND gate 570 may output a high signal, which may be input to the D input and received by the flip-flop 590.

On the next leading clock edge, the activation signal may transition back to low. The flip-flop 590 may store the high signal from the AND gate 570, storing a one. This may cause the output waveform, from Q, to transition to high. The output waveform may be output to any suitable hardware or software that may use the output waveform for any suitable purpose. The output waveform may also be fed back to the OR gate 560, keeping the output from the OR gate 560 high even though the activation signal has transitioned to low. The pulse width counter 520 may increment the pulse width counter value by one. The pulse width comparator one 540 may compare the pulse width counter value to the channel pulse width value, and may output a high signal if they are equal, or a low signal if they are not equal. When the pulse width comparator one 540 outputs a low signal, the OR gate 580 may output a low signal which may be inverted to a high signal before entering the AND gate 570. The AND gate 570 may continue to output a high signal to the D input of the flip-flop 590, as the OR gate 560 may also be outputting a high signal due to the output waveform from Q being high.

The flip-flop 590 may receive the high signal, and on the next leading clock edge may continue to store a one and output the waveform as high. This may repeat for each leading clock edge for which the pulse width counter value is less than the channel pulse width register.

When the pulse width counter value is incremented on a leading clock edge to be equal to the channel pulse width value, the pulse width comparator one 540 may output a high signal. This may cause the OR gate 580 to output a high signal which may be inverted to a low signal before entering the AND gate 580. The low signal input to the AND gate 580 may cause the AND gate 580 to output a low signal, even while the OR gate 560 is still outputting a high signal. The low signal output by the AND gate 580 may be received by the flip-flip 590, which may continue to keep the output waveform high. On the next leading clock edge, the flip-flop 590 may store the low signal, storing a zero, causing the output waveform to transition to low. This may result in the OR gate 560 transitioning to low. The pulse width counter 520 may increment the pulse width counter value again, and may end up higher than the channel pulse width value, or may roll over back to zero. In either case, the pulse width counter value may no longer be equal to the channel pulse width value. The pulse width comparator one 540 may output a low signal, which may cause the OR gate 580 to output a low signal which may be inverted to a high signal before entering the AND gate 570. Because the OR gate 560 may be outputting a low signal, the AND gate 570 may continue to output a low signal, which may be received by the flip-flop 590. On the next leading clock edge, the flip-flop 590 may store the low signal, continuing to store a zero and keeping the output waveform low. This may repeat while the activation signal remains low, until the activation signal transitions to high. In this way, the waveform may remain high for a number of clock cycles equal to the pulse width assigned to the channel after the pulse width module 320 is activated by the activation signal, as determined by the channel pulse width value and the reset value for the pulse width counter value. There may be a delay of one clock cycle between when the activation signal that activates the pulse width module 320 is received and when the output waveform from the pulse width module 320 transitions to high.

For example, the channel 121 may be assigned a pulse width of five. The activation signal may be low. The flip-flop 590 may store a zero, the pulse width counter value of the pulse width counter 520 may be any value, and the channel pulse width register 510 may store any value. While the activation signal remains low, the output waveform from the flip-flop 590 may remain low. The activation signal may then transition to high, for example, on a leading clock edge that causes the phase counter module 110 to output a phase counter value that is equal to the channel phase value for the channel 121, causing the phase module 310 to transition the activation signal from low to high. The high activation signal may enable the RST input of the pulse width counter 520, which may reset the pulse width counter value to zero. The high activation signal may enable the WR input of the channel pulse width register 510, which may allow the channel pulse width value of five to be written to the channel pulse width register 510. The high activation signal may also cause output from the OR gate 560 to transition to high. The pulse width comparator one 540 may output a low signal to the OR gate 580, as the pulse width counter value of zero may not be equal to the channel pulse width value of five. The pulse width comparator two 550 may also output a low signal, as the channel pulse width value of five may not be equal to zero. OR gate 580, receiving two low signals, may output a low signal, which may be inverted to a high signal before entering the AND gate 570. As the OR gate 560 may also be outputting a high signal to the AND gate 570, the AND gate 570 may transition to high. The high signal from the AND gate 570 may be received by the D input of the flip-flop 590, which may receive the high signal. The waveform from the Q output of the flip-flop 590 may remain low, as the flip-flop 590 may still store a zero.

On the next leading clock edge, the flip-flop 590 may store the high signal, storing a one. This may cause the waveform from the Q output of the flip-flop 590 to transition to high. The high output waveform may be fed back to the OR gate 560. The activation signal may transition to low, but the OR gate 560 may continue to output a high signal based on the high output waveform. The pulse width counter 520 may increment the pulse width counter value from zero to one. The pulse width comparator one 540 may continue to output a low signal, as the pulse width counter value of one may not be equal to the channel pulse width value of five. This may cause the OR gate 580 to continue to output a low signal, which may be inverted to a high signal before entering the AND gate 580. Because the OR gate 560 may be outputting a high signal and the OR gate 580 may be outputting a low signal, the AND gate 580 may continue to output a high signal to the D input of the flip flop 590. The high signal may be received by the flip-flop 590. This may be the first clock cycle for which the output waveform is high.

On the next leading clock edge, marking the end of the first clock cycle for which the output waveform is high, the flip-flop 590 may store the high signal, continuing to store a one, which may keep the output waveform high. The activation signal may remain low. The output signals from all components of the pulse width module 320 may remain the same as they were the previous clock cycle except for the pulse width counter value output from the pulse width counter 520, which may have been incremented from one to two. This may be the second clock cycle for which the output waveform is high. This may repeat on the next two leading clock edges, where the pulse width counter value increases from two to three, and from three to four. The leading clock edge on which the pulse width counter increase from three to four may mark the end of the third clock cycle for which the output waveform is high, and the beginning of the fourth clock cycle for which the output waveform is high.

On the next leading clock edge, marking the end of the fourth clock cycle and beginning of the fifth clock cycle for which the output waveform is high, the flip-flop 590 may store the high signal from the AND gate 570 generated when the pulse width counter value was four on the previous clock cycle before the signal from the AND gate 570 transitions to low when the pulse width counter 520 increments, storing a one and keeping the output waveform high. The pulse width counter 520 may increment the pulse width counter value to five. This may cause the pulse width comparator 540 to output a high signal, as the pulse width counter value of five may be equal to the channel pulse width value of five. The OR gate 580 may transition to high based on the high signal from the pulse width comparator 540. The high signal from the OR gate 580 may be inverted to a low signal before entering the AND gate 570, and may cause the AND gate 570 to output a low signal to the D input of the flip-flop 590. The flip-flop 590 may receive low signal, but may keep the output waveform high, as the flip-flop 590 may still store a one based on the high signal from the AND gate 570 that was present at the D input on the clock edge.

On the next leading clock edge, marking the end of the fifth clock cycle for which the output waveform is high, the flip-flop 590 may store the low signal from the AND gate 570, storing a zero. The output waveform may transition to low, after having been high for five clock cycles, as specified by the channel pulse width value for the channel 121. The OR gate 560 may transition to low as a result of the output waveform being low. The pulse width counter 520 may continue to count, incrementing the pulse width counter value to six. This may cause the pulse width comparator one 540 to output a low signal, resulting in the OR gate 580 outputting a low signal, inverted to a high signal before entering the AND gate 570. The AND gate 570 may output a low signal 570 due to the low signal output by the OR gate 560, resulting in the flip-flop 590 receiving a low signal. The output waveform may remain low for the succeeding clock edges until the activation signal transitions to high, indicating activation of the channel 121.

The use of flip-flops in a channel, such as flip-flop 430 and flip-flop 590, may result in the output waveform from the channel being delayed by two clock cycles from the time the phase counter 210 has counted to the phase assigned to the channel. Other components and arrangements may be used in the phase counter module 110, phase module 310, and pulse width module 320, which may increase or decrease this delay.

In some implementations, the pulse width counter 520 may count down. If the pulse width counter 520 counts down, the channel pulse width value may be stored in the pulse width counter 520 when the pulse width counter 520 is reset, and the channel pulse width register 510 may store some value greater than zero which the pulse width counter 520 may count down to. Storing zero in the channel pulse width register 510 may still prevent the output waveform from transitioning to high due to the zeros 530 and the pulse width comparator two 550. The channel pulse width value may be set based on the value greater than zero stored in the channel pulse width register 510 to ensure the output waveform is high for the desired number of clock signals.

Figure 6:
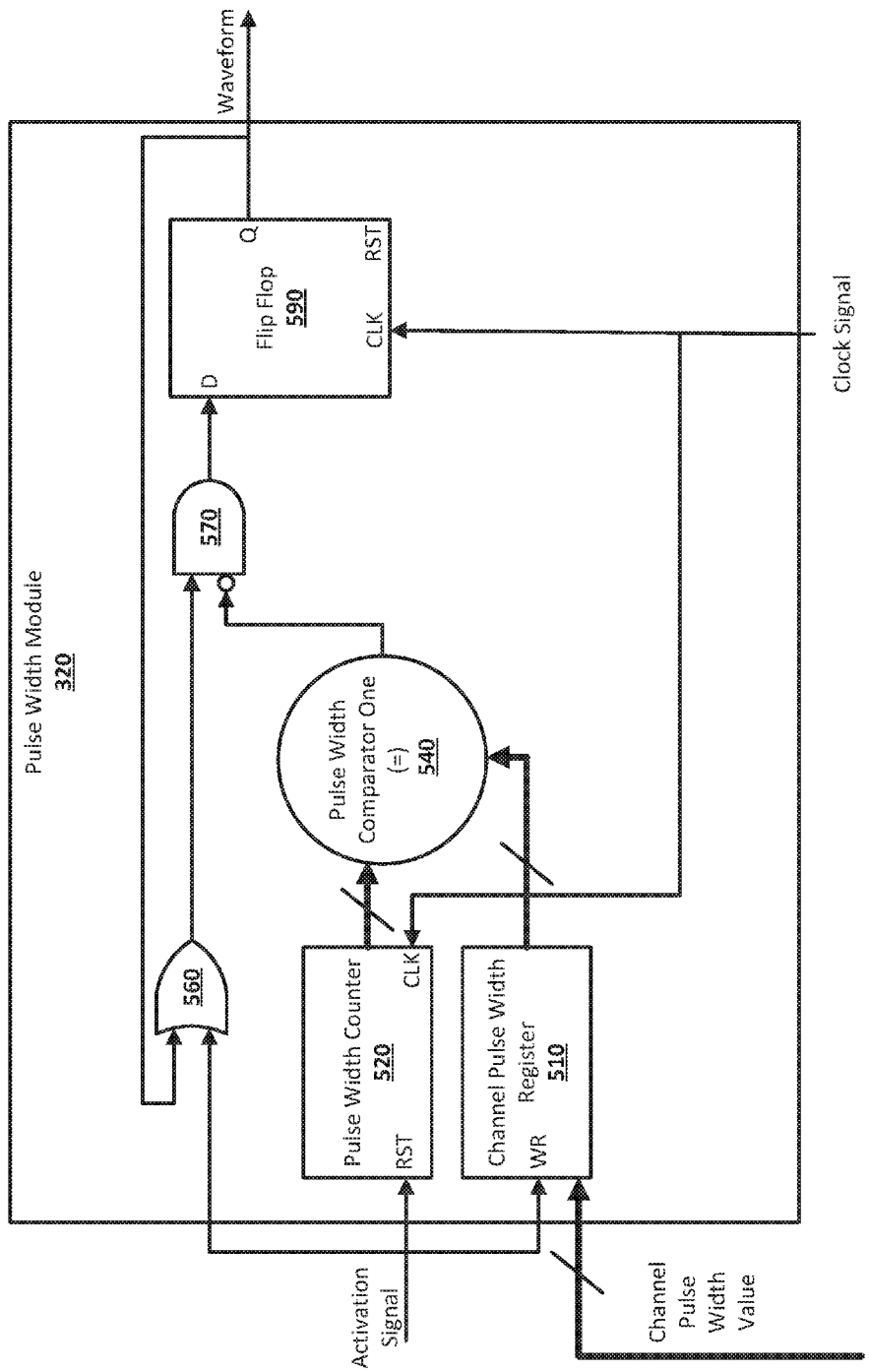
FIG. 6 shows an example system suitable for a multichannel waveform synthesis engine according to an implementation of the disclosed subject matter.

FIG. 6 shows an example system suitable for a multichannel waveform synthesis engine according to an implementation of the disclosed subject matter. The pulse width module 320 may be implemented without the zeros 530, the pulse width comparator two 550, and the OR gate 580. In this implementation, the signal output from the pulse width comparator one 540 may be inverted and input to the AND gate 570. In this implementation, the pulse width counter 520 may count up or down. If the pulse width counter 520 counts down, the channel pulse width value may be stored in the pulse width counter 520 when the pulse width counter 520 is reset, and the channel pulse width register 510 may store zeroes, or may store some other value which the pulse width counter 520 may count down to.

Figure 7:
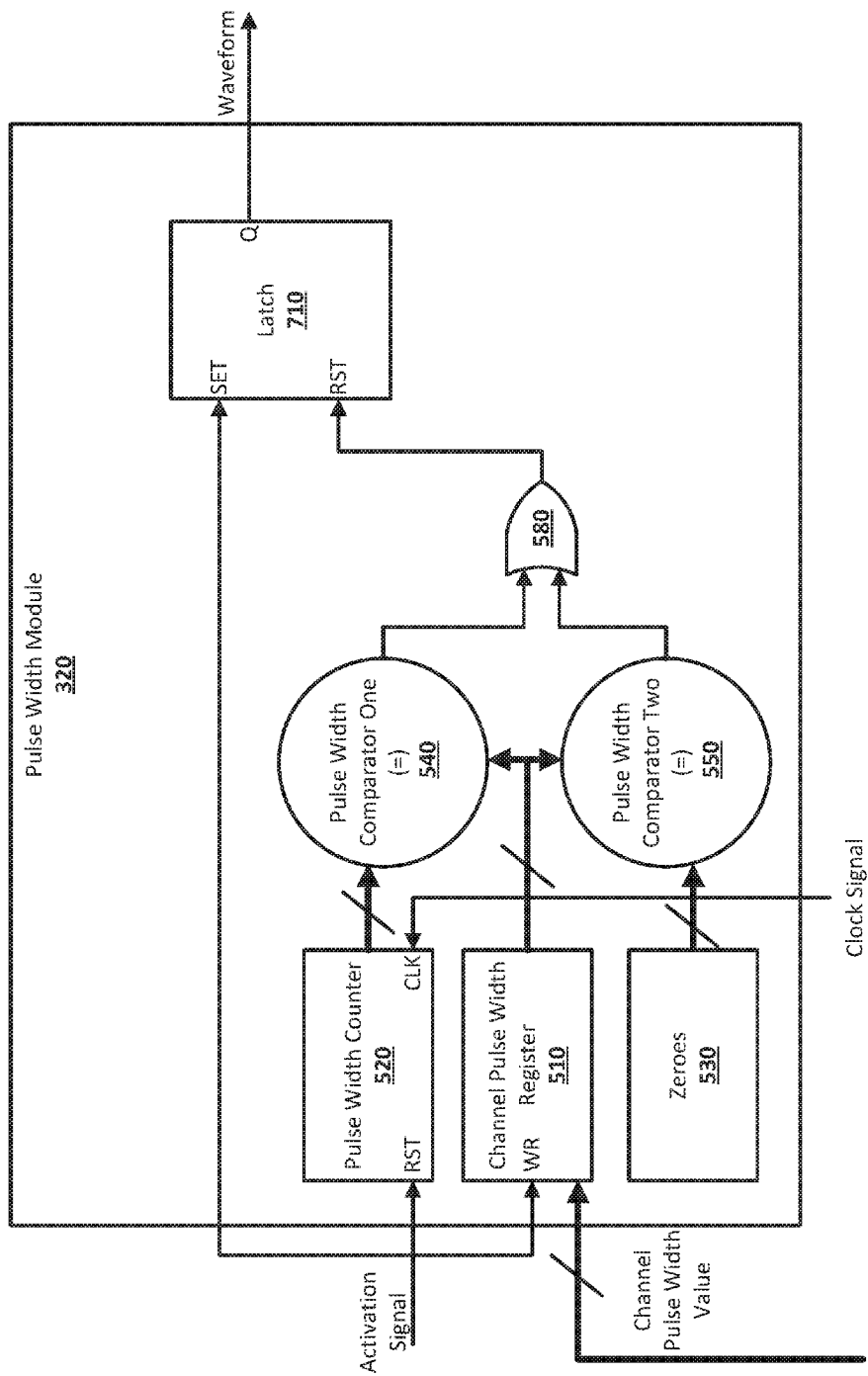
FIG. 7 shows an example system suitable for a multichannel waveform synthesis engine according to an implementation of the disclosed subject matter.

FIG. 7 shows an example system suitable for a multichannel waveform synthesis engine according to an implementation of the disclosed subject matter. The pulse width module 320 may be implemented without the OR gate 560, the AND gate 570, and the flip-flop 590. The pulse width module may include a latch 710 in place of the flip-flop 590. The latch 710 may be any suitable implementation of latch using any suitable combination of hardware and software. The latch 710 may be able to store one bit, and output a signal based on the stored bit. The latch 710 may include a SET input, a RST input, and a Q output. The SET input may be asynchronous, and when enabled, for example, by a high signal, may cause the latch 710 to store a one. A low signal to the SET input may not cause any change to the bit stored by the latch 710. The RST input may be asynchronous, and when enabled, for example, by a high signal, may cause the latch 710 to store a zero. A low signal to the RST input may not cause any change to the bit stored by the latch 710. The latch 710 may output, on the Q output a signal indicating the bit being stored. For example, if the latch 710 is storing a one, the Q output may output a high signal, and if the latch 710 is storing a zero, the Q output a low signal, or vice versa.

The SET input of latch 710 of the pulse width module 320 may receive as input the activation signal directly from the phase module 310. RST input of the latch 710 may receive as input the signal output from the OR gate 580. The Q output of the latch 710 may output the waveform for the channel of the pulse width module 320. When the activation signal transitions to high, the latch 710 may immediately store a one and begin outputting the waveform as high. When the pulse width counter 520 increments the pulse width counter value to equal the channel pulse width value stored in the channel pulse width register 510, causing the pulse width comparator one 540 to output a high signal to the OR gate 580 and the OR gate 580 to output a high signal to the RST input, the latch 710 may immediately store a zero and transition the output waveform to low. The output waveform may not transition back to high until the activation signal transitions back to high. This may allow the pulse width module 320 to output the waveform as high for the number of clock cycles indicated by the channel pulse width value without a one clock cycle delay between the activation signal transitioning to high and the waveform transitioning to high, and without a one clock cycle delay between the pulse width counter value equaling the channel pulse width value and the waveform transitioning to low.

Figure 8:
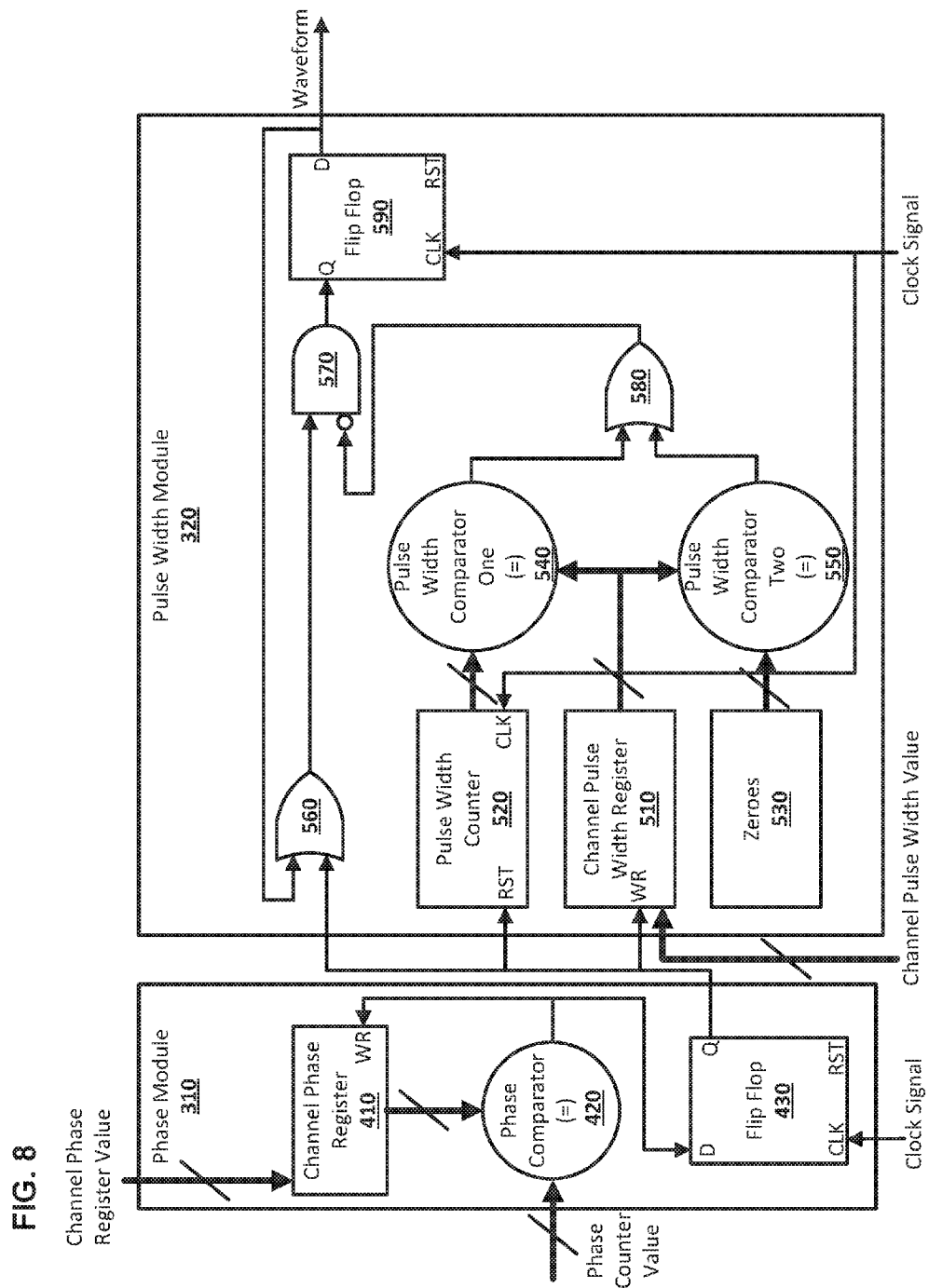
FIG. 8 shows an example system suitable for a multichannel waveform synthesis engine according to an implementation of the disclosed subject matter.

FIG. 8 shows an example system suitable for a multichannel waveform synthesis engine according to an implementation of the disclosed subject matter. A channel of the multichannel waveform synthesis engine 100, such as the channel 121, the Nth channel 131, or any channel in-between, may include both a phase module 310 and a pulse width module 320. The activation signal may be transmitted to the pulse width module 320 from the phase module 310. No other signals may need to be transmitted from the phase module 310 to the pulse width module 320 for the channel to function properly, and no signals may need to be transmitted from the pulse width module 320 to the phase module 310 for the channel to function properly. In some implementations, other signals, such as the clock signals, may be transmitted between the phase module 310 and the pulse width module 320.

Figure 9:
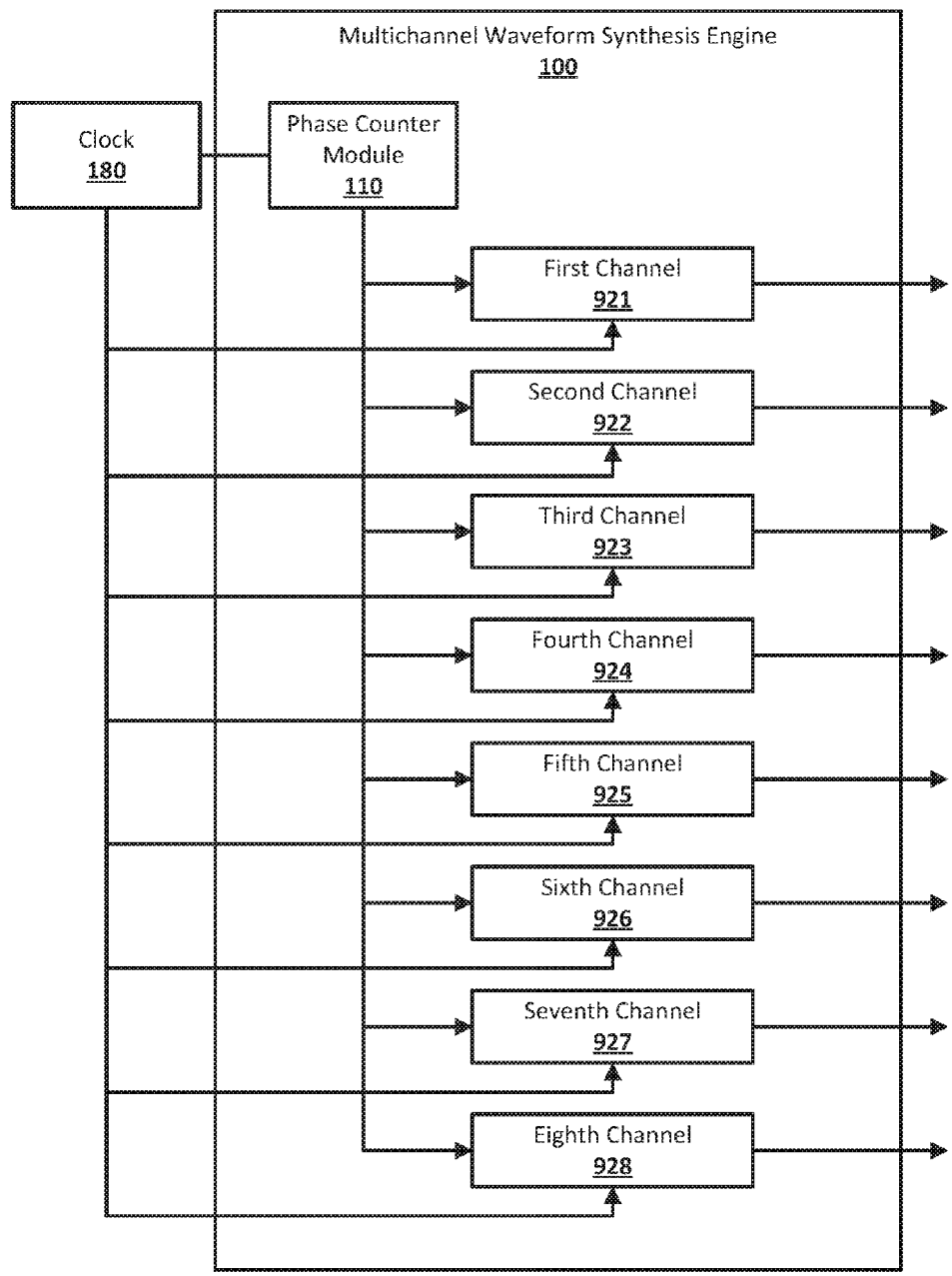
FIG. 9 shows an example system suitable for a multichannel waveform synthesis engine according to an implementation of the disclosed subject matter.

FIG. 9 shows an example system suitable for a multichannel waveform synthesis engine according to an implementation of the disclosed subject matter. The multichannel waveform synthesis engine 100 may include any number of channels, include tens, hundreds, thousands, or millions of channels, with each channel outputting its own waveform. For example, a multichannel waveform synthesis engine 100 may include eight channels, a first channel 921, a second channel 922, a third channel 923, a fourth channel 924, a fifth channel 925, a sixth channel 926, a seventh channel 927, and an eighth channel 928, each of which may receive a clock signal from the clock 180 and phase counter values output by the phase counter module 110.

Figure 10:
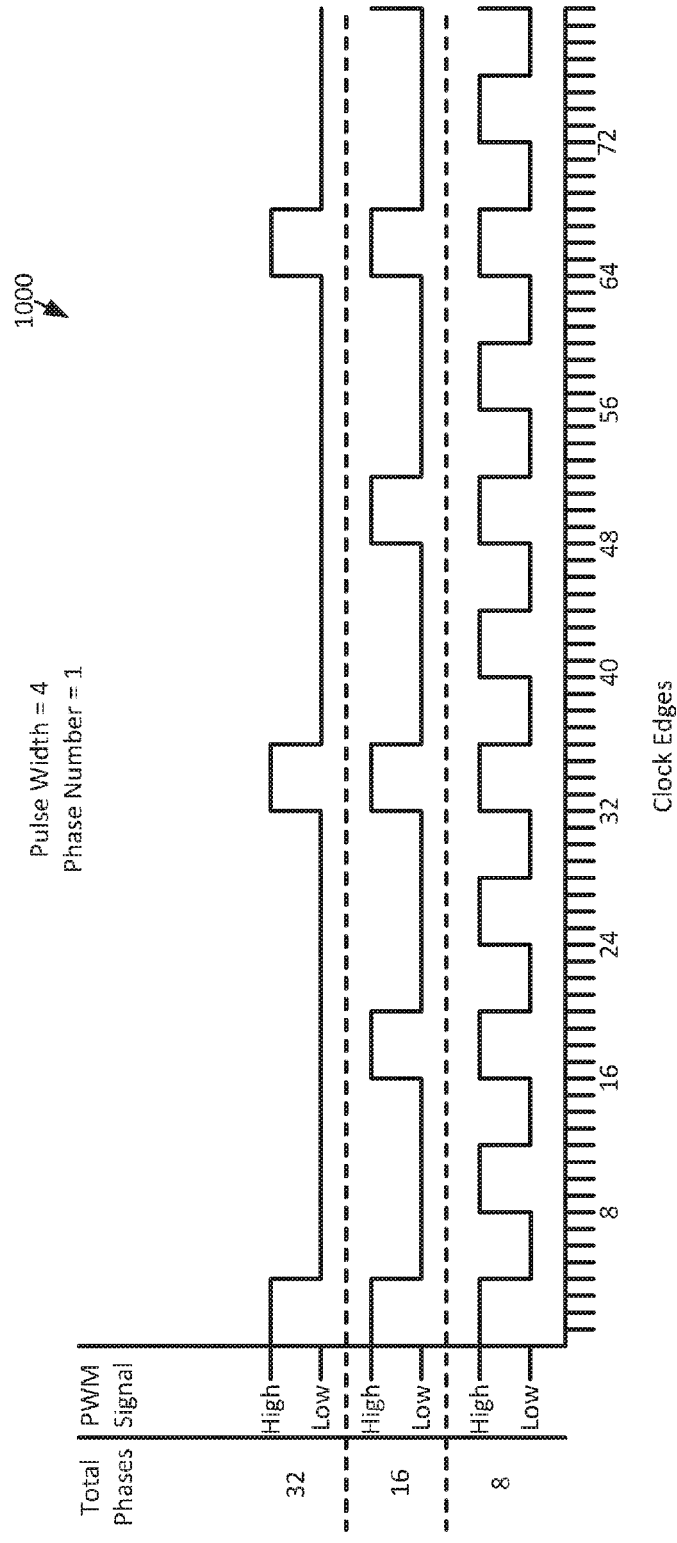
FIG. 10 shows example signal traces for a multichannel waveform synthesis engine according to an implementation of the disclosed subject matter.

FIG. 10 shows example signal traces for a multichannel waveform synthesis engine according to an implementation of the disclosed subject matter. The frequency with which a channel outputs a high waveform may be determined by the number of phases available. The signal trace 1000 may show signal traces for a channel with a pulse width of four and a phase number of one when the total number of phases available is 32, 16, and 8, and when the phase counter, such as the phase counter 210, counts up from zero. The distance between two adjacent clock edges on the signal trace 1000 may represent one clock cycle, for example, for the clock signal from the clock 180. For example, the first channel 921 may have an assigned pulse width of four and an assigned phase number of one. This may be set in the first channel 921 using a channel pulse width value of four and a channel phase value of zero.

When there are 32 available phases, the output waveform from the first channel 921 may be output as high starting on the $0^{th}$ clock edge, for example, when the phase counter value is zero, not accounting for any delays introduced by the phase module 310 or the pulse width module 320. The output waveform from the first channel 921 may remain high for four clock cycles, in accordance with the pulse width of four assigned to the first channel 921, and may then transition to low on the fourth clock edge. The output waveform from the first channel 921 may remain low until the $32^{nd}$ clock edge, may again be high for four clock cycles before transitioning back to low, and may transition back to high on the $64^{th}$ clock edge, and so on. With 32 phases available, the first channel 921 may output a waveform with a frequency that is 1/32 the frequency of the clock signal. With an pulse width of four, the waveform may have a duty cycle of 12.5%

When there are 16 available phases, the output waveform from the first channel 921 may be output as high starting on the $0^{th}$ clock edge, for example, when the phase counter value is zero, not accounting for any delays introduced by the phase module 310 or the pulse width module 320. The output waveform from the first channel 921 may remain high for four clock cycles, in accordance with the pulse width of four assigned to the first channel 921, and may then transition to low on the fourth clock edge. The output waveform from the first channel 921 may remain low until the $16^{th}$ clock edge, may again be high for four clock cycles before transitioning back to low, and may transition back to high on the $32^{nd}$ clock edge, $48^{th}$ clock edge, and so on. With 16 phases available, the first channel 921 may output a waveform with a frequency that is 1/16 the frequency of the clock signal. With an pulse width of four, the waveform may have a duty cycle of 25%

When there are 8 available phases, the output waveform from the first channel 921 may be output as high starting on the $0^{th}$ clock edge, for example, when the phase counter value is zero, not accounting for any delays introduced by the phase module 310 or the pulse width module 320. The output waveform from the first channel 921 may remain high for four clock cycles, in accordance with the pulse width of four assigned to the first channel 921, and may then transition to low on the fourth clock edge. The output waveform from the first channel 921 may remain low until the $8^{th}$ clock edge, may again be high for four clock cycles before transitioning back to low, and may transition back to high on the $16^{th}$ clock edge, $24^{th}$ clock edge $32^{nd}$ clock edge, and so on. With 8 phases available, the first channel 921 may output a waveform with a frequency that is 1/8 the frequency of the clock signal. With an pulse width of four, the waveform may have a duty cycle of 50%

In all cases, the actual output of the waveform by the channel 921 may be delayed by one or more clock cycles, for example, by the use of the flip-flop 430 and the flip-flop 590. For example, with 32 available phases and a two clock cycle delay, the waveform may transition to high on the $2^{nd}$, $34^{th}$, and $66^{th}$ clock edges. The signal trace 1000 assumes that the pulse width assigned to the first channel 921 is four at all times, though the pulse width assigned to the first channel 921 may be changed every time the waveform transitions to high. The signal trace 1000 assumes that the phase number assigned to the first channel 921 is one at all times, though the phase number assigned to the first channel 921 may be changed every time the phase counter value matches the channel phase value for the first channel 921.

Figure 11:
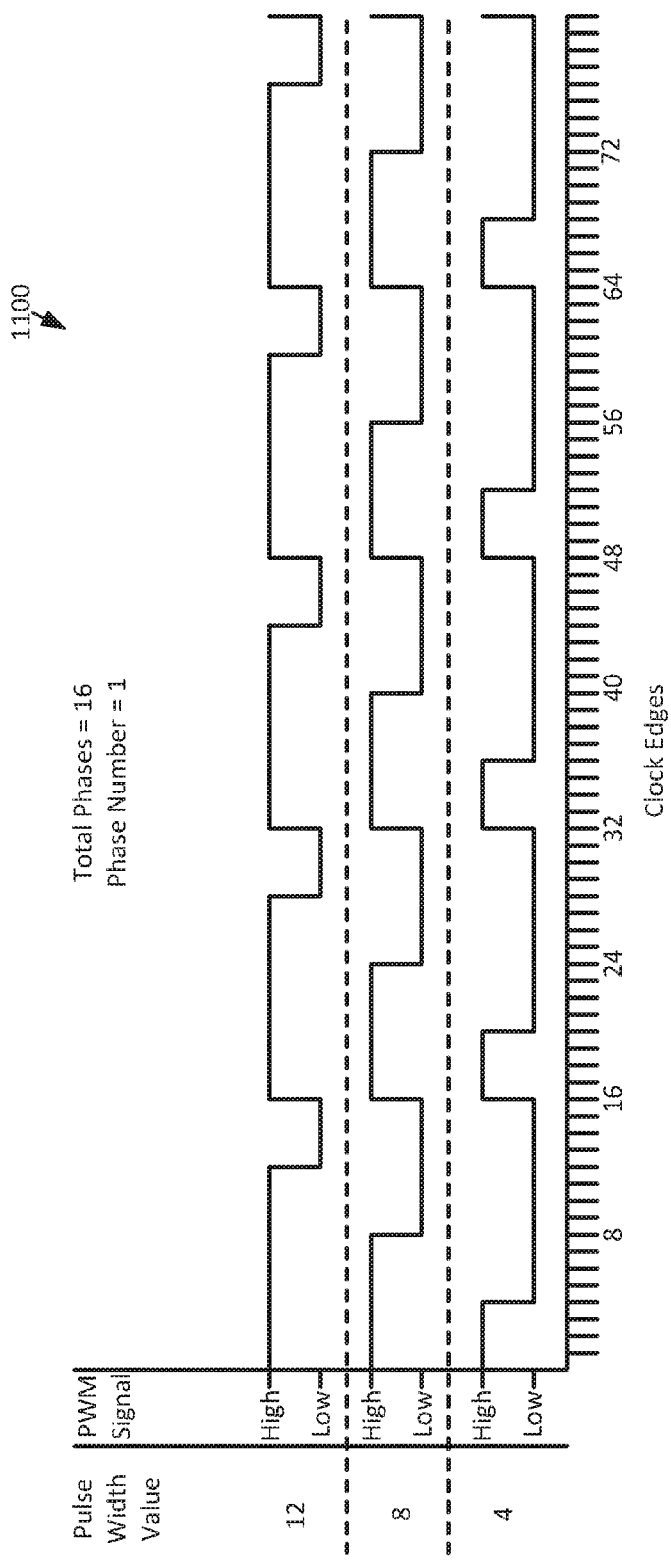
FIG. 11 shows example signal traces suitable for a multichannel waveform synthesis engine according to an implementation of the disclosed subject matter.

FIG. 11 shows example signal traces suitable for a multichannel waveform synthesis engine according to an implementation of the disclosed subject matter. The width of the waveform output by a channel may be determined by the pulse width assigned to the channel. The signal trace 1100 may show signal traces for a channel with an phase number of one when the total number of phases available is 16, when the pulse width of the channel is 12, 8 and 4, and when the phase counter, such as the phase counter 210, counts up from zero. The distance between two adjacent clock edges on the signal trace 1100 may represent one clock cycle, for example, for the clock signal from the clock 180. For example, the first channel 921 may have an assigned phase number of one, and may have assigned pulse widths of 12, 8, and 4. This may be set in the first channel 921 using channel pulse width values of 12, 8, and 4, and a channel phase value of zero.

When the channel pulse width value is 12, the output waveform from the first channel 921 may be output as high starting on the $0^{th}$ clock edge, for example, when the phase counter value is zero, not accounting for any delays introduced by the phase module 310 or the pulse width module 320. The output waveform from the first channel 921 may remain high for 12 clock cycles, in accordance with the pulse width of 12 assigned to the first channel 921, and may then transition to low on the $12^{th}$ clock edge. The output waveform from the first channel 921 may remain low for four clock cycles, until the $16^{th}$ clock edge, may again be high for twelve clock cycles before transitioning back to low, and may transition back to high on the $32^{nd}$ clock edge, $48^{th}$ clock edge, and so on, remaining high for 12 clock cycles each time. With an pulse width of 12, the waveform may have a duty cycle of 75%

When the channel pulse width value is eight, the output waveform from the first channel 921 may be output as high starting on the $0^{th}$ clock edge, for example, when the phase counter value is zero, not accounting for any delays introduced by the phase module 310 or the pulse width module 320. The output waveform from the first channel 921 may remain high for eight clock cycles, in accordance with the pulse width of eight assigned to the first channel 921, and may then transition to low on the eighth clock edge. The output waveform from the first channel 921 may remain low for eight clock cycles, until the $16^{th}$ clock edge, may again be high for eight clock cycles before transitioning back to low, and may transition back to high on the $32^{nd}$ clock edge, $48^{th}$ clock edge, and so on, remaining high for eight clock cycles each time. With an pulse width of eight, the waveform may have a duty cycle of 50%

When the channel pulse width value is four, the output waveform from the first channel 921 may be output as high starting on the $0^{th}$ clock edge, for example, when the phase counter value is zero, not accounting for any delays introduced by the phase module 310 or the pulse width module 320. The output waveform from the first channel 921 may remain high for four clock cycles, in accordance with the pulse width of four assigned to the first channel 921, and may then transition to low on the fourth clock edge. The output waveform from the first channel 921 may remain low for 12 clock cycles, until the $16^{th}$ clock edge, may again be high for four clock cycles before transitioning back to low, and may transition back to high on the $32^{nd}$ clock edge, $48^{th}$ clock edge, and so on, remaining high for four clock cycles each time. With an pulse width of eight, the waveform may have a duty cycle of 25%

In all cases, the actual output of the waveform by the channel 921 may be delayed by one or more clock cycles, for example, by the use of the flip-flop 430 and the flip-flop 590. For example, with 16 available phases and a two clock cycle delay, the waveform may transition to high on the $2^{nd}$, $18^{th}$, and $34^{th}$ clock edges. The signal trace 1100 assumes that the phase number assigned to the first channel 921 is one at all times, though the phase number assigned to the first channel 921 may be changed every time the phase counter value matches the channel phase value for the first channel 921. The signal trace 1100 assumes that the number of phases available is sixteen at all times, though the number of phases available may be changed, for example, every time the phase counter 210 expires, for example when the phase counter value reaches fifteen.

Figure 12:
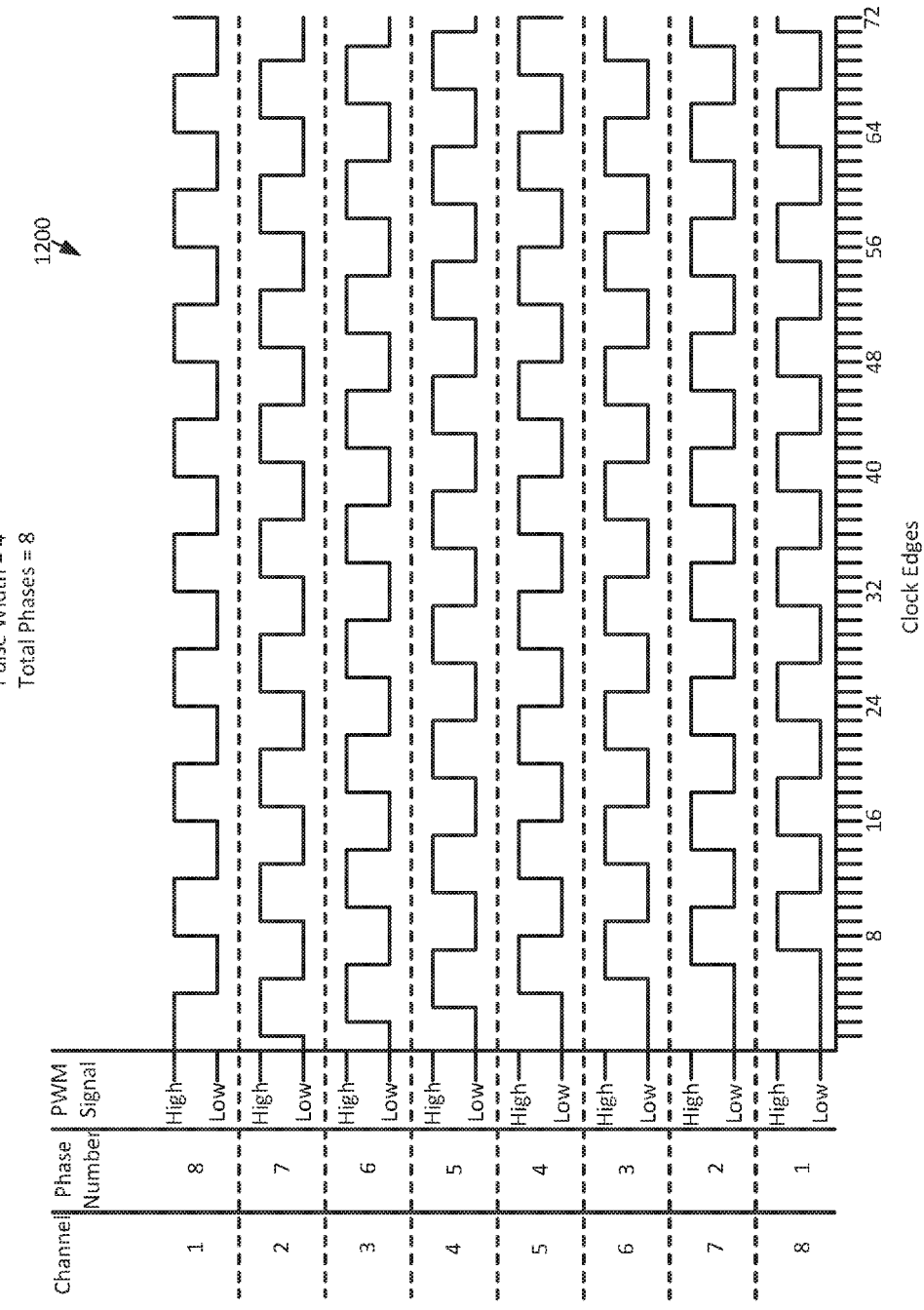
FIG. 12 shows example signal traces suitable for a multichannel waveform synthesis engine according to an implementation of the disclosed subject matter.

FIG. 12 shows example signal traces suitable for a multichannel waveform synthesis engine according to an implementation of the disclosed subject matter. Each channel of the multichannel waveform synthesis engine 100 may be assigned its own, independent, phase number, which may determine the phase of the output waveforms relative to each other. For example, the multichannel waveform synthesis engine 100 may have eight channels, the first channel 921, the second channel 922, the third channel 923, the fourth channel 924, the fifth channel 925, the sixth channel 926, the seventh channel 927, and the eighth channel 928. The signal trace 1200 may show signal traces for eight channels when the total number of phases available is 8, each channel has an pulse width of 4, and when the phase counter, such as the phase counter 210, counts down from one less than the number of phases to zero. The first channel 921 may be assigned a phase number of 8, the second channel 922 may be assigned a phase number of 7, the third channel 923 may be assigned a phase number of 6, the fourth channel 924 may be assigned a phase number of 5, the fifth channel 925 may be assigned a phase number of 4, the sixth channel 926 may be assigned a phase number of 3, the seventh channel 927 may be assigned a phase number of 2, and the eighth channel 928, may be assigned a phase number of 1. The distance between two adjacent clock edges on the signal trace 1100 may represent one clock cycle, for example, for the clock signal from the clock 180. The phase numbers may be set in each channel by setting a channel phase value that is one less than the channel's phase number, for example, with the first channel 921 having a channel phase value of 7, and the eighth channel 928 having a channel phase value of 0.

The output waveform from the first channel 921 may be output as high starting on the $0^{th}$ clock edge, for example, when the phase counter value is seven, not accounting for any delays introduced by the phase module 310 or the pulse width module 320. The output waveform from the first channel 921 may remain high for four clock cycles, in accordance with the pulse width of four assigned to the first channel 921, and may then transition to low on the fourth clock edge, before transitioning back to high on the $8^{th}$ clock edge, $16^{th}$ clock edge, and so on.

The output waveform from the second channel 922 may be output as high starting on the $1^{st}$ clock edge, for example, when the phase counter value is six. The output waveform from the second channel 922 may remain high for four clock cycles and may then transition to low on the $5^{th}$ clock edge, before transitioning back to high on the $9^{th}$ clock edge, $17^{th}$ clock edge, and so on. The phase difference between the output waveforms from the first channel 921 and second channel 922 may be 45 degrees.

The output waveform from the third channel 923 may be output as high starting on the $2^{nd}$ clock edge, for example, when the phase counter value is five. The output waveform from the third channel 923 may remain high for four clock cycles and may then transition to low on the $6^{th}$ clock edge, before transitioning back to high on the $10^{th}$ clock edge, $18^{th}$ clock edge, and so on. The phase difference between the output waveforms from the first channel 921 and third channel 923 may be 90 degrees.

The output waveform from the fourth channel 924 may be output as high starting on the $3^{rd}$ clock edge, for example, when the phase counter value is four. The output waveform from the fourth channel 924 may remain high for four clock cycles and may then transition to low on the $7^{th}$ clock edge, before transitioning back to high on the $11^{th}$ clock edge, $19^{th}$ clock edge, and so on. The phase difference between the output waveforms from the first channel 921 and fourth channel 924 may be 135 degrees.

The output waveform from the fifth channel 925 may be output as high starting on the $4^{th}$ clock edge, for example, when the phase counter value is three. The output waveform from the fifth channel 925 may remain high for four clock cycles and may then transition to low on the $8^{th}$ clock edge, before transitioning back to high on the $12^{th}$ clock edge, $20^{th}$ clock edge, and so on. The phase difference between the output waveforms from the first channel 921 and fifth channel 925 may be 180 degrees.

The output waveform from the sixth channel 926 may be output as high starting on the $5^{th}$ clock edge, for example, when the phase counter value is two. The output waveform from the sixth channel 926 may remain high for four clock cycles and may then transition to low on the $9^{th}$ clock edge, before transitioning back to high on the $13^{th}$ clock edge, $21^{th}$ clock edge, and so on. The phase difference between the output waveforms from the first channel 921 and sixth channel 926 may be 225 degrees.

The output waveform from the seventh channel 927 may be output as high starting on the $6^{th}$ clock edge, for example, when the phase counter value is one. The output waveform from the seventh channel 927 may remain high for four clock cycles and may then transition to low on the $10^{th}$ clock edge, before transitioning back to high on the $14^{th}$ clock edge, $22^{th}$ clock edge, and so on. The phase difference between the output waveforms from the first channel 921 and seventh channel 927 may be 270 degrees.

The output waveform from the eighth channel 928 may be output as high starting on the $7^{th}$ clock edge, for example, when the phase counter value is zero. The output waveform from the eighth channel 928 may remain high for four clock cycles and may then transition to low on the $11^{th}$ clock edge, before transitioning back to high on the $15^{th}$ clock edge, $23^{th}$ clock edge, and so on. The phase difference between the output waveforms from the first channel 921 and eight channel 928 may be 315 degrees.

In all cases, the actual output of the waveforms by the channels of the multichannel waveform synthesis engine 100 may be delayed by one or more clock cycles, for example, by the use of the flip-flop 430 and the flip-flop 590. The signal trace 1200 assumes that the pulse width assigned each of the channels is four at all times, though the pulse width assigned to each channel may be changed every time the waveform transitions to high, and each channel may have a different, independently assigned pulse width. The signal trace 1200 assumes that the phase number assigned to each channel does not change for each channel, though the phase number assigned each channel may be changed every time the phase counter value matches the channel phase value for the channel. The signal trace 1200 assumes that the number of phases available is eight at all times, though the number of phases available may be changed, for example, every time the phase counter 210 expires, for example, when the phase counter value reaches zero.

Figure 13:
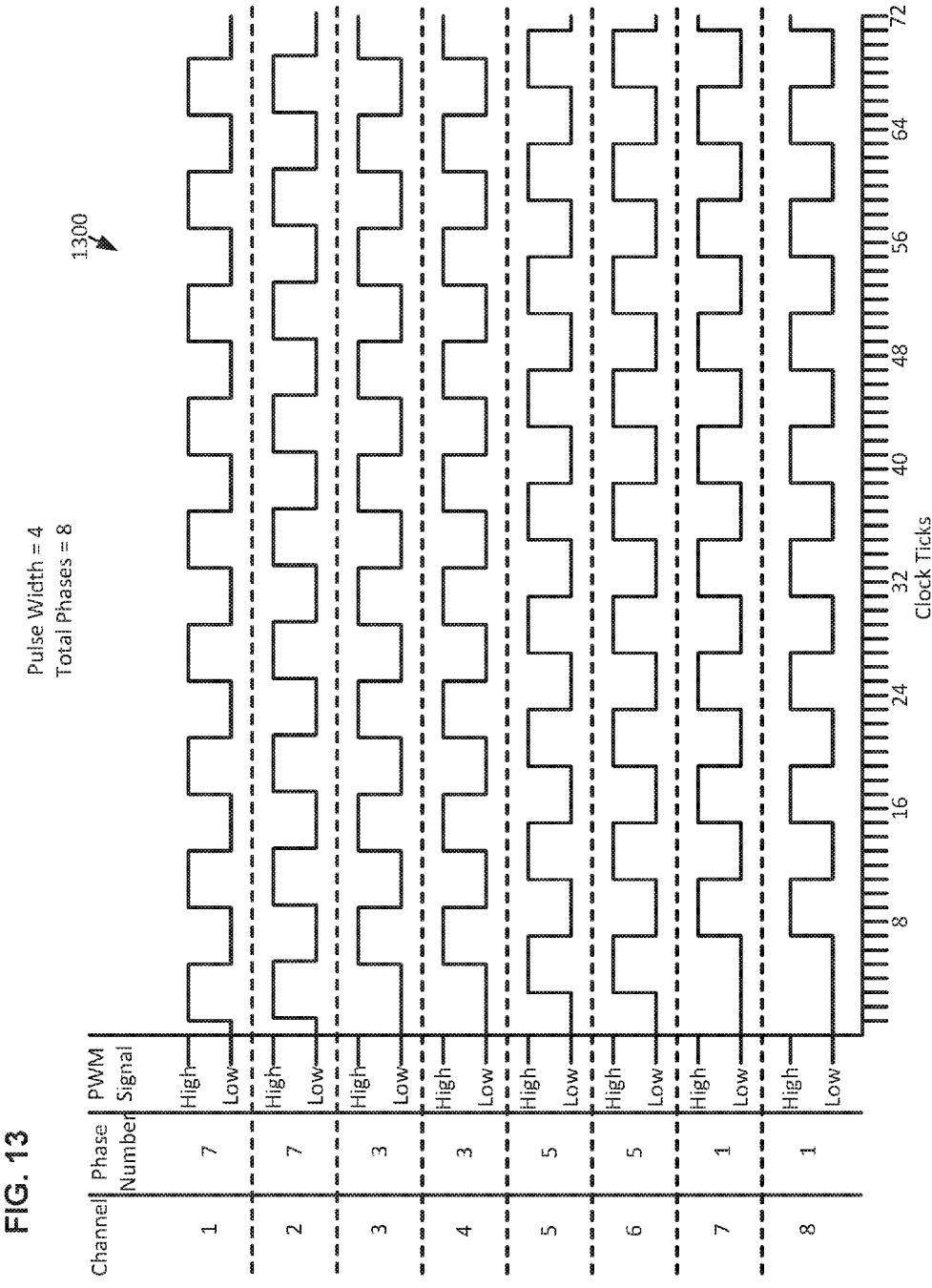
FIG. 13 shows example signal traces suitable for a multichannel waveform synthesis engine according to an implementation of the disclosed subject matter.

FIG. 13 shows example signal traces suitable for a multichannel waveform synthesis engine according to an implementation of the disclosed subject matter. The phase numbers assigned to each of the channel of the multichannel waveform synthesis engine 100 may be independent of each other. Any channel may be assigned any phase number for an available phase, and not all available phases need to be used at any given time. Phase numbers do not need to be assigned to channels in any order. Multiple channels may be assigned the same phase number, resulting in the output waveforms from those channels having no phase difference.

For example, the signal trace 1300 may show signal traces for eight channels when the total number of phases available is 8, each channel has an pulse width of 4, and when the phase counter, such as the phase counter 210, counts down from one less than the number of phases to zero. With 8 phases available, the first channel 921 and the second channel 922 may each be assigned a phase number of 7, the third channel 923 and fourth channel 924 may each be assigned a phase number of 3, the fifth channel 925 and the sixth channel 926 may each be assigned a phase number of 5, and the seventh channel 927 and the eighth channel 928 may each be assigned a phase number of 1. This may result in various phase difference between the channels. For example, the phase difference between the first channel 921 and the third channel 923 may be 180 degrees. The phase difference between the first channel 921 and the fifth channel 925 may be 90 degrees. The phase difference between the first channel 921 and the seventh channel 927 may be 270 degrees. The phase difference between the fifth channel 925 and the seventh channel 927 may be 180 degrees. The phase differences between all of the channels may be controlled by the phase numbers of the phases available that are assigned to the different channels, for example, through the use of the channel phase value stored in the channel phase register 410 for each channel.

Figure 14:
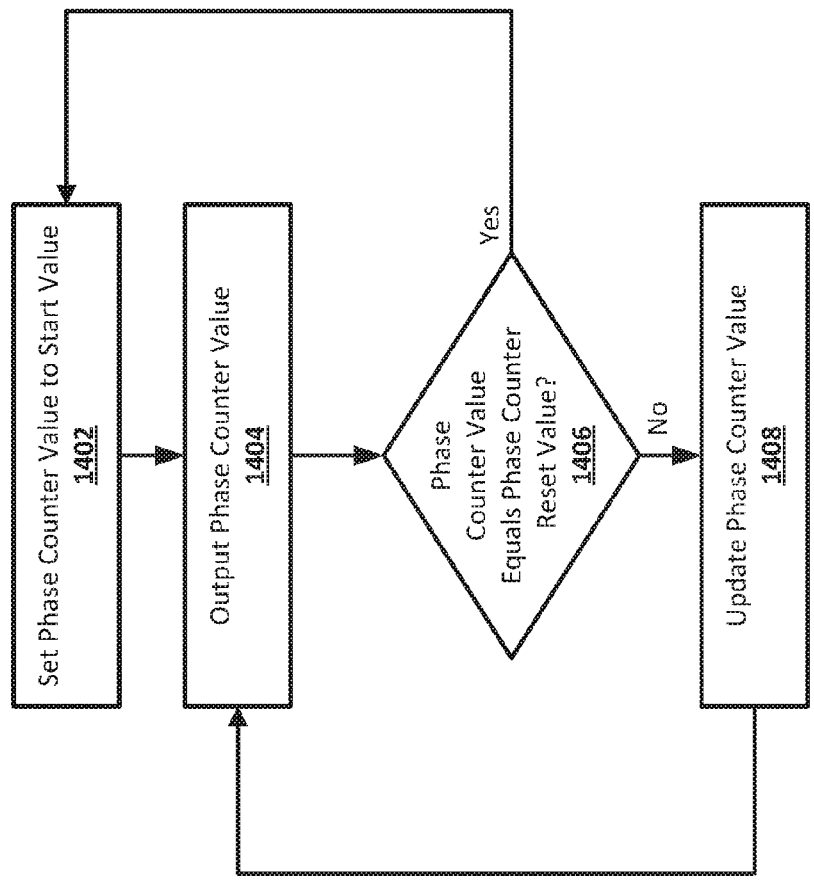
FIG. 14 shows an example procedure suitable for a multichannel waveform synthesis engine according to an implementation of the disclosed subject matter.

FIG. 14 shows an example procedure suitable for a multichannel waveform synthesis engine according to an implementation of the disclosed subject matter. At 1402, a phase counter value may be set to a start value. For example, the phase counter value of the phase counter 210 may be set to the phase counter start value, which may be zero if the phase counter counts up, or the number of phases available minus one if the phase counter counts down. A phase counter reset value may also be set. For example, if the phase counter 210 counts down, the phase counter reset value may be set to zero, and may not need to be changed. If the phase counter 210 counts up, the phase counter reset value may be set to the number of phases available minus one.

At 1404, the phase counter value may be output. For example, the phase counter 210 of the phase counter module 110 may output the current phase counter value to each phase module 310 of each channel of the multichannel waveform synthesis engine 100. The phase counter value may output in any suitable manner. For example, the phase counter value may output in parallel, so that all of the bits of the phase counter value are received by a phase module 310 in one clock cycle.

At 1406, it may be determined whether the phase counter value is equal to the phase counter reset value. For example, the phase counter comparator 220 may compare the current phase counter value to the phase counter reset value stored in the phase counter reset register 230. If the phase counter value is equal to the phase counter reset value, the phase counter 210 may expire, and flow may proceed to 1402, where the phase counter value may be reset to the phase counter start value, which may be changed. The phase counter reset value may also be changed. Otherwise, flow may proceed to 1408.

At 1408, the phase counter value may be updated. For example, the phase counter 210 may increment or decrement the phase counter value by one, or by some other counting increment used by the phase counter 210. Flow may then proceed to 1404, where the phase counter value may again be output.

Figure 15:
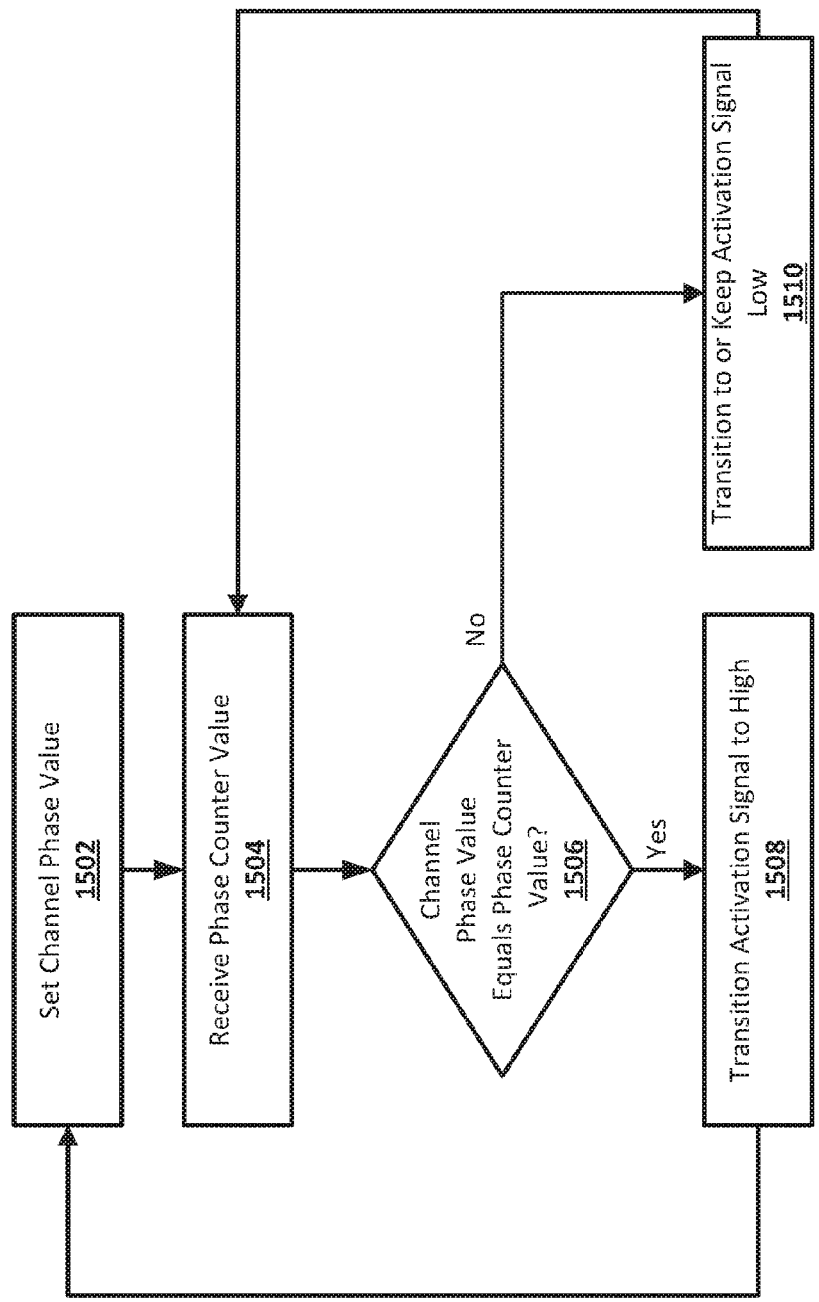
FIG. 15 shows an example procedure suitable for a multichannel waveform synthesis engine according to an implementation of the disclosed subject matter.

FIG. 15 shows an example procedure suitable for a multichannel waveform synthesis engine according to an implementation of the disclosed subject matter. At 1502, a channel phase value may be set. For example, the channel 121 may be assigned a phase number from the phases available. The channel phase value set for the channel 121 may be associated with the phase number assigned to the channel. For example, the channel phase value may be one less than the phase number assigned to the channel. The channel phase value may be stored in the phase module 310 of the channel 121, for example, in the channel phase register 410.

At 1504, a phase counter value may be received. For example, the phase module 310 of the channel 121 may receive the phase counter value output by phase counter module 110. The phase counter value may be input to, for example, the phase comparator 420.

At 1506, it may be determined whether the channel phase value is equal to the phase counter value. For example, the phase comparator 420 may compare the phase counter value from the phase counter module 110 to the channel phase value stored in the channel phase register 230. If the phase counter value is equal to the channel phase value, flow may proceed to 1508, where the activation signal may be transitioned to high. Otherwise, flow may proceed to 1510.

At 1508, the activation signal may be transitioned to high. For example, the activation signal output by the phase module 310 may be transitioned from low to high. The activation signal may be transitioned by, for example, the flip-flop 430. Flow may proceed back to 1502, and the activation signal may remain high until it is transitioned back to low.

At 1510, the activation signal may be transitioned to low, or kept low. For example, if the activation signal output from the phase module 310 is currently low, the activation signal may continue to be output as low. If the transition signal output from the phase module 310 is currently high, the activation signal may be transitioned to low, for example, by the flip-flop 430.

Figure 16:
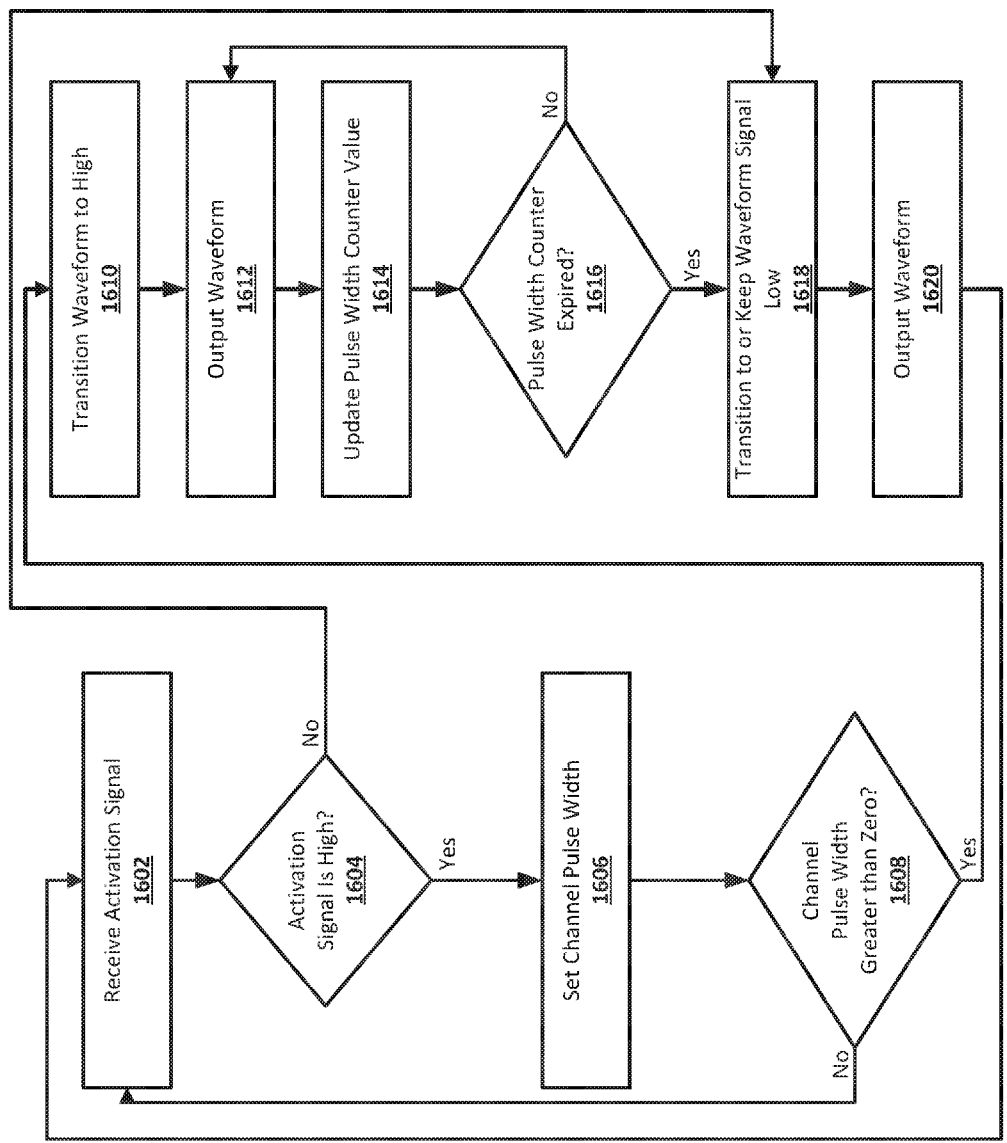
FIG. 16 shows an example procedure suitable for a multichannel waveform synthesis engine according to an implementation of the disclosed subject matter.

FIG. 16 shows an example procedure suitable for a multichannel waveform synthesis engine according to an implementation of the disclosed subject matter. At 1602, an activation signal may be received. For example, an activation signal may be received at the pulse width module 320 of the channel 121 from the phase module 310 of the channel 121.

At 1604, it may be determined whether the activation signal is high. If the activation signal is low, flow may proceed to 1618. If the activation signal is high, flow may proceed to 1606.

At 1606, the channel pulse width may be set. For example, the channel pulse width may be set for the channel 121 by storing a received channel pulse width value in the channel pulse width register 510 of the pulse width module 320 and resetting the pulse width counter value to zero if the pulse width counter 520 counts up, or resetting the pulse width counter value to the received channel pulse width value and storing a zero in the channel pulse width register 510 if the pulse width counter 520 counts down.

At 1608, it may be determined if the channel pulse width is greater than zero. The channel pulse width may be the absolute value of the difference between the channel pulse width value and either zero or some other number to which the pulse width counter 520 counts down to or up from. For example, if the pulse width counter 520 counts up, the channel pulse width may be the channel pulse width value stored in the channel pulse width register 510 minus the value to which pulse width counter 520 resets, for example, zero. If the pulse width counter 520 counts down, the channel pulse width may be the channel pulse width value to which the pulse width counter value resets minus the value stored in the channel pulse width register 510 to which the pulse width counter 520 counts down. If the channel pulse width is not greater than zero, flow may proceed back 1602, and waveform may not be transitioned to high. If the channel pulse width is greater than zero, flow may proceed to 1610.

At 1610, a waveform may be transitioned to high. For example, the flip-flop 590, or latch 710, of the pulse width module 320 may transition a low output waveform to high.

At 1612, the waveform may be output. For example, the high output waveform may be output from the Q output of the flip-flop 590 or the latch 710. The output waveform may be output to any suitable hardware or software, and may be used in any suitable application.

At 1614, the pulse width counter value may be updated. For example, the pulse width counter 520 may update the pulse width counter value by incrementing or decrementing the value by one or some other counting increment.

At 1616, it may be determined whether the pulse width counter has expired. For example, the channel pulse width counter 520 may expire when the pulse width counter value has been incremented to be equal to the channel pulse width value, for example, stored in the channel pulse width register 510, or when the pulse width counter value has been decremented to zero or some other value used to set the channel pulse width stored in the channel pulse width register 510. If the pulse width counter has expired, flow may proceed to 1618. Otherwise, flow may proceed to 1612, where the high waveform may continue to be output.

At 1618, the waveform may transitioned to, or kept, low. For example, if the output waveform is currently low, the output waveform may remain low. If the output waveform is currently high, the output waveform may be transitioned to low, for example, by the flip-flop 590 or the latch 710.

At 1620, the waveform may be output. For example, the low output waveform may be output from the Q output of the flip-flop 590 or the latch 710. The output waveform may be output to any suitable hardware or software, and may be used in any suitable application.

Figure 17:
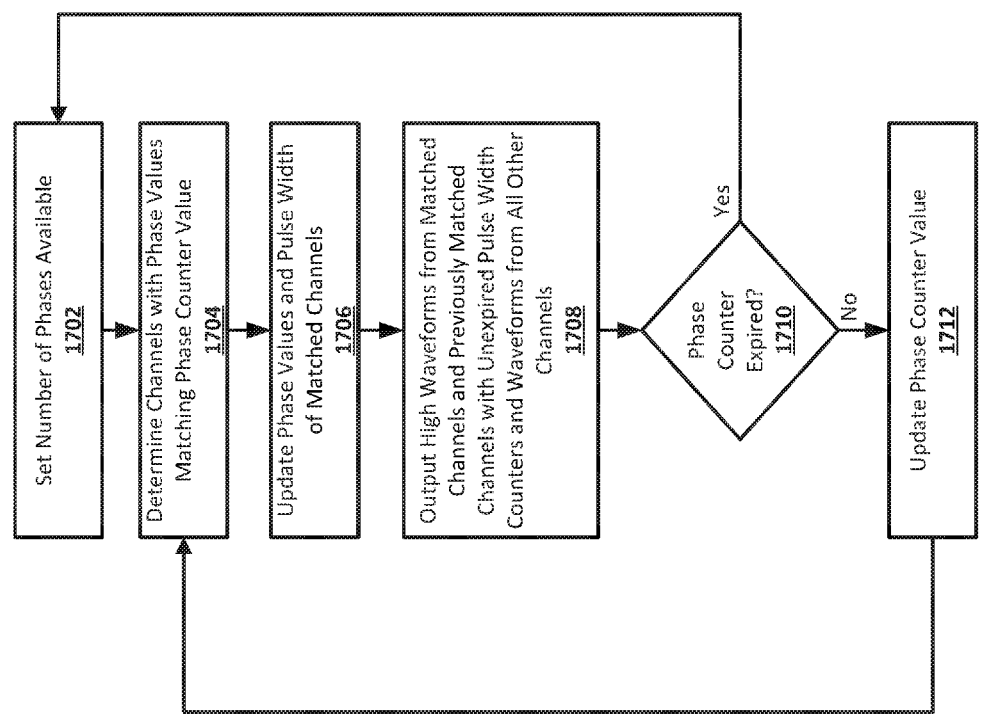
FIG. 17 shows an example procedure suitable for a multichannel waveform synthesis engine according to an implementation of the disclosed subject matter.

FIG. 17 shows an example procedure suitable for a multichannel waveform synthesis engine according to an implementation of the disclosed subject matter. At 1702, a number of available phases may be set. For example, the phase counter module 110 of the multichannel waveform synthesis engine 100 may be set with a phase counter start value and phase counter reset value with a difference equal to the number of available phases minus one. For, the phase counter value of the phase counter 210 may be set to the phase counter start value, which may be the number of phases available minus one if the phase counter 210 counts down, and zero if the phase counter 210 counts up. The phase counter reset value may be set to zero if the phase counter 210 counts down, or to the number of phases available if the phase counter 210 counts up.

At 1704, the channels with a phase value matching the phase counter value may be determined. For example, the multichannel waveform synthesis engine 100 may include the channel 121, the Nth channel 131, and some number of channels in-between. Each channel may have an assigned phase number, which may set in each channel by a channel phase value stored in the channel phase register 410 of the channel's phase module 310. Each channel may compare its channel phase value to the phase counter value to determine if they match.

At 1706, the phase value and pulse width of matched channels may be updated. For example, each channel of the multichannel waveform synthesis engine 100 with a channel phase value that matched the phase counter value may receive a new channel phase value, which may be the same as or different than the channel's previous channel phase value. The new channel phase value may be stored in the channel phase register 410 for the channel. Each matched channel may also receive a new pulse width. The new pulse width may be set by, for example, a new channel pulse width value, or a new value to which the pulse width counter 520 of the channel may reset.

At 1708, high waveforms may be output from matched channels, and channels that were previously matched and do not have expired pulse width counters, and low waveform may be output from all other channels. For example, the multichannel waveform synthesis engine 100 may output high waveforms from matched channels based on the current phase counter value, and from each channel that matched a previous phase counter value and has a pulse width counter 520 that has not expired since the match. All other channels, which may not be matched channels based on the current phase counter value, and may have their pulse width counter 520 expire since their previous match, may output a low waveform.

At 1710, it may be determined whether the phase counter has expired. For example, the phase counter 210 may expire when the phase counter value equals the phase counter reset value stored in the phase counter reset register 230. If the phase counter has expired, flow may proceed back to 1702. Otherwise flow may proceed to 1712, where the number of available phases may be set to a new a number, or kept the same.

At 1712, the phase counter value may be updated. For example, the phase counter 210 may increment or decrement the phase counter value. Each pulse width counter 520 for each channel may also update their respective pulse width counter values, for example, incrementing or decrementing the pulse width counter values. Flow may then proceed back to 1704, where matched channels for the updated phase counter value may be determined.

Any input of any component of the multichannel waveform synthesis engine 100 may be active high or active low, and output signals of any such component may be high or low for any set of output conditions for the component. For example, any WR input, such as the WR input on the channel phase register 410, may be active high or active low. Any output, such as the output from phase comparator 420, may be high or low in either condition, for example, when the values input to the phase comparator 420 are equal. Signals between components may be inverted as appropriate based on which inputs are active high and active low, and which output conditions lead to high and low output signals from various components. Input and output signals may be activated by transitioning from low to high or from high to low, and deactivated in the opposite manner in which they are activated. Signals may be binary or analog, with low and high represented by analogy signals in any suitable manner. Components activated on clock edges may be activated on leading or trailing edges of the clock, or may be activated in the middle of a high or low portion of a clock cycle. Different components in the same multichannel waveform synthesis engine 100 may be activated on leading and trailing edges of the clock. For example, the same multichannel waveform synthesis engine 100 may include a phase counter 210 that is activated on leading clock edges and a flip-flop 430 that is activated on trailing clock edges. Components may activate in a delayed manner. For example, a flip-flop activated by a leading clock edge the output of a flip-flop may change its output signal from high to low or low to high some time during a high portion of the clock cycle, after receiving the leading edge, instead of immediately after receiving the leading edge.

Figure 18:
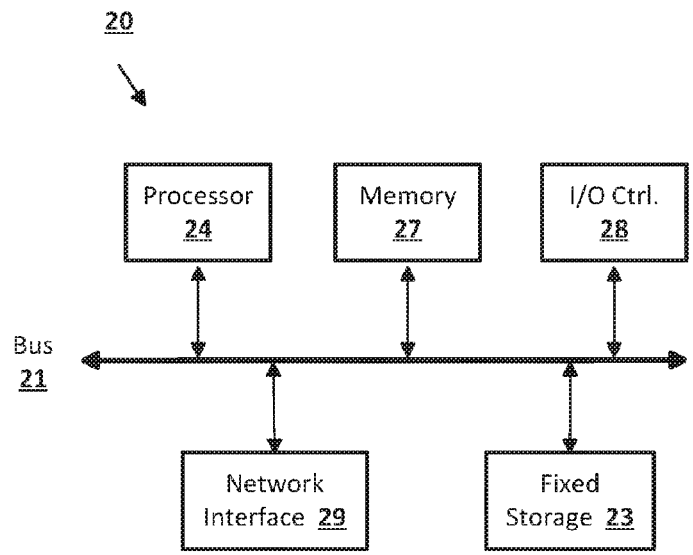
FIG. 18 shows a computer according to an embodiment of the disclosed subject matter.

Embodiments of the presently disclosed subject matter may be implemented in and used with a variety of component and network architectures. FIG. 18 is an example computer system 20 suitable for implementing embodiments of the presently disclosed subject matter. The computer 20 includes a bus 21 which interconnects major components of the computer 20, such as one or more processors 24, memory 27 such as RAM, ROM, flash RAM, or the like, an input/output controller 28, and fixed storage 23 such as a hard drive, flash storage, SAN device, or the like. It will be understood that other components may or may not be included, such as a user display such as a display screen via a display adapter, user input interfaces such as controllers and associated user input devices such as a keyboard, mouse, touchscreen, or the like, and other components known in the art to use in or in conjunction with general-purpose computing systems.

The bus 21 allows data communication between the central processor 24 and the memory 27. The RAM is generally the main memory into which the operating system and application programs are loaded. The ROM or flash memory can contain, among other code, the Basic Input-Output system (BIOS) which controls basic hardware operation such as the interaction with peripheral components. Applications resident with the computer 20 are generally stored on and accessed via a computer readable medium, such as the fixed storage 23 and/or the memory 27, an optical drive, external storage mechanism, or the like.

Each component shown may be integral with the computer 20 or may be separate and accessed through other interfaces. Other interfaces, such as a network interface 29, may provide a connection to remote systems and devices via a telephone link, wired or wireless local- or wide-area network connection, proprietary network connections, or the like. For example, the network interface 29 may allow the computer to communicate with other computers via one or more local, wide-area, or other networks, as shown in FIG. 19.

Many other devices or components (not shown) may be connected in a similar manner, such as document scanners, digital cameras, auxiliary, supplemental, or backup systems, or the like. Conversely, all of the components shown in FIG. 18 need not be present to practice the present disclosure. The components can be interconnected in different ways from that shown. The operation of a computer such as that shown in FIG. 18 is readily known in the art and is not discussed in detail in this application. Code to implement the present disclosure can be stored in computer-readable storage media such as one or more of the memory 27, fixed storage 23, remote storage locations, or any other storage mechanism known in the art.

Figure 19:
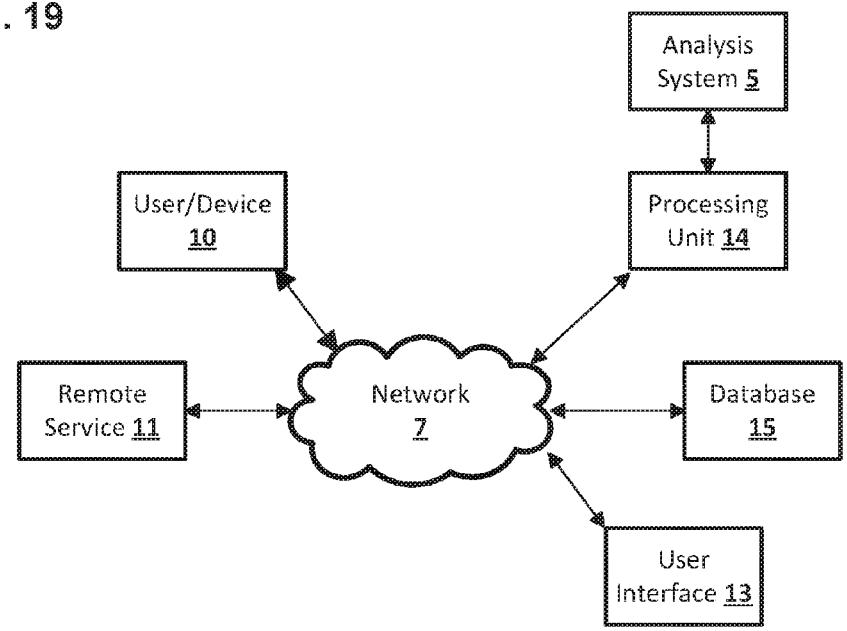
FIG. 19 shows a network configuration according to an embodiment of the disclosed subject matter.

FIG. 19 shows an example arrangement according to an embodiment of the disclosed subject matter. One or more clients 10, 11, such as local computers, smart phones, tablet computing devices, remote services, and the like may connect to other devices via one or more networks 7. The network may be a local network, wide-area network, the Internet, or any other suitable communication network or networks, and may be implemented on any suitable platform including wired and/or wireless networks. The clients 10, 11 may communicate with one or more computer systems, such as processing units 14, databases 15, and user interface systems 13. In some cases, clients 10, 11 may communicate with a user interface system 13, which may provide access to one or more other systems such as a database 15, a processing unit 14, or the like. For example, the user interface 13 may be a user-accessible web page that provides data from one or more other computer systems. The user interface 13 may provide different interfaces to different clients, such as where a human-readable web page is provided to web browser clients 10, and a computer-readable API or other interface is provided to remote service clients 11. The user interface 13, database 15, and processing units 14 may be part of an integral system, or may include multiple computer systems communicating via a private network, the Internet, or any other suitable network. Processing units 14 may be, for example, part of a distributed system such as a cloud-based computing system, search engine, content delivery system, or the like, which may also include or communicate with a database 15 and/or user interface 13. In some arrangements, an analysis system 5 may provide back-end processing, such as where stored or acquired data is pre-processed by the analysis system 5 before delivery to the processing unit 14, database 15, and/or user interface 13. For example, a machine learning system 5 may provide various prediction models, data analysis, or the like to one or more other systems 13, 14, 15.

The foregoing description, for purpose of explanation, has been described with reference to specific embodiments. However, the illustrative discussions above are not intended to be exhaustive or to limit embodiments of the disclosed subject matter to the precise forms disclosed. Many modifications and variations are possible in view of the above teachings. The embodiments were chosen and described in order to explain the principles of embodiments of the disclosed subject matter and their practical applications, to thereby enable others skilled in the art to utilize those embodiments as well as various embodiments with various modifications as may be suited to the particular use contemplated.

The invention claimed is:

1. A system comprising:
   a phase counter module adapted and configured to count to a value corresponding to a number of phases available, output a phase counter value indicating a current phase from the number of phases available, and reset the phase counter value when the phase counter value reaches a phase counter reset value;

one or more channels adapted and configured to output a waveform, each of the one or more channels comprising:

a phase module adapted and configured to receive the phase counter value output from the phase counter module, and activate an activation signal when the phase counter value indicates a phase assigned to the channel from the number of phases available; and a pulse width module adapted and configured to receive the activation signal, and when the activation signal is activated, activate a waveform for a period of time indicated by a pulse width assigned to the channel, and deactivate the waveform after the period of time indicated by the pulse width assigned to the channel.

2. The system of claim 1, wherein the phase counter expires when the phase counter value indicates a last of the number of phases available.

3. The system of claim 1, wherein the phase counter module is further adapted and configured to reset the phase counter value by setting the phase counter value to indicate a first of the number of phases available.

4. The system of claim 1, wherein a phase x from the number of phases available is indicated by a phase counter value of x−1, wherein x is greater than 0.

5. The system of claim 1, wherein activating the activation signal comprises transitioning the activation signal from low to high.

6. The system of claim 1, wherein activating the output waveform from a channel of the one or more channels comprises transitioning the output waveform from low to high.

7. The system of claim 1, wherein each of the one or more channels is assigned a phase from the number of phases available independently from every other of the one or more channels.

8. The system of claim 1, wherein each of the one or more channels is assigned a pulse width independently from every other of the one or more channels.

9. The system of claim 1, wherein the phase module of at least one of the one or more channels is further adapted and configured to receive a channel phase value indicating the phase assigned to the channel from the number of phases available.

10. The system of claim 9, wherein the phase module of at least one of the one or more channels is further adapted and configured to receive a new channel phase value when the phase counter value indicates a phase assigned to the channel from the number of phases available, wherein the new channel phase value indicates either the same phase or a different phase than a previous channel phase value.

11. The system of claim 1, wherein the pulse width module of at least one of the one or more channels is further adapted and configured to receive a channel pulse width value indicating the pulse width assigned to the channel.

12. The system of claim 11, wherein the pulse width module of at least one of the one or more channels is further adapted and configured to receive a new channel pulse width value when the activation signal is activated.

13. The system of claim 1, further comprising a clock adapted and configured to output a clock signal to one or more of the phase counter module and the pulse width module.

14. The system of claim 1, wherein the phase counter module is adapted and configured to count up, and wherein a first of the number of phases available is indicated by a lowest channel phase value, and wherein the value corresponding to the number of phases available is the number of phases available minus one plus the lowest channel phase value.

15. The system of claim 1, wherein the phase counter module is adapted and configured to count down, and wherein a first of the number of phase available is indicated by a highest channel phase value, and wherein the value corresponding to the number of phases available is the highest channel phase value minus the number of phases available plus one.

16. The system of claim 1, wherein the phase counter module comprises:

a phase counter adapted and configured to count to the value corresponding to the number of phases available by one of incrementing and decrementing the phase counter value;

a phase counter reset register adapted and configured to store the phase counter reset value; and a phase counter comparator adapted and configured to cause the phase counter to reset the phase counter value when the phase counter value is equal to the phase counter reset value.

17. The system of claim 16, wherein the phase counter is adapted and configured to receive a phase counter start value when the phase counter resets the phase counter value and to store the phase counter start value as the phase counter value.

18. The system of claim 16, wherein the phase counter register is adapted and configured to receive a phase counter reset value when the phase counter resets the phase counter value.

19. The system of claim 1, wherein a first channel of the one or more channels is assigned a phase from the number of phases available, and wherein a second channel of the one or more channels is assigned a different phase from the number of phases available.

20. The system of claim 1, wherein a first channel is assigned a first pulse width, and wherein a second channel is assigned a second pulse width different from the first pulse width.

21. The system of claim 1, wherein the pulse width module of at least one of the one or more channels further comprises:

a pulse width counter adapted and configured to count to a value corresponding to the pulse width assigned to the channel, wherein the period of time during which the waveform is active ends based on the expiration of the pulse width counter.

22. A method comprising:

receiving a value indicating number of phases available;

setting a phase counter value of a phase counter and a phase counter reset value based on the value indicating the number of phases available;

for each of the number of phases available:

determining any channel with an already active waveform that has not reached the end of a period of time indicated by a pulse width assigned to the channel since the waveform became active, and keeping the waveform from any such channel active;

determining any channel comprising an assigned phase indicated by the phase counter value, and activating the waveform from any such channel;

determining any channel with an already active waveform that has reached the end of a period of time indicated by a pulse width assigned to the channel and deactivating the waveform from any such channel; and updating the phase counter value.

23. The method of claim 22, further comprising:
after updating the phase counter value to a value indicating the last of the number of phases available, receiving a new value indicating a number of phases available.

24. The method of claim 22, wherein determining that a channel with an active waveform has reached the end of a period of time indicated by a pulse width assigned to the channel is based on a pulse width counter value of a pulse width counter of the channel.

25. The method of claim 22, wherein a channel with an active waveform has reached the end of a period of time indicated by a pulse width assigned to the channel based on a pulse width counter value of a pulse width counter of the channel when the pulse width counter value indicates that the pulse width counter has expired.

26. The method of claim 22, further comprising:
after determining any channel comprising an assigned phase indicated by the phase counter value, receiving at any such a channel one or more of a value indicating a new assigned phase for the channel and a value indicating a new pulse width for the channel.

27. The method of claim 22, wherein a phase assigned to any channel is any one phase from the number of phases available.

28. The method of claim 22, wherein a pulse width assigned to any channel is a pulse width of any length.

29. The method of claim 22, wherein activating a waveform further comprises transitioning the waveform from low to high.

30. The method of claim 22, wherein updating the phase counter value occurs based on receiving an edge of a clock signal.

31. The method of claim 22, wherein the pulse width assigned to a channel indicates a number of clock cycles, and wherein the period of time ends when the number of clock cycles indicated by the pulse width assigned to the channel elapse after the waveform of the channel is activated.

32. A method comprising:
receiving a phase counter value at a channel of multi-channel waveform synthesis engine;
determining that the phase counter value indicates a phase that was assigned to the channel;
activating a waveform output from the channel in response to the determining that the phase counter value indicates the phase that was assigned to the channel; and
deactivating the waveform output from the channel after a period of time indicated by a pulse width assigned to the channel has elapsed.

33. The method of claim 32, further comprising:
after determining that the phase counter value indicates a phase that was assigned to the channel, receiving one or more of a value indicating a new phase assigned to the channel and a value indicating a new pulse width assigned to the channel.

34. The method of claim 32, further comprising:
determining that the period of time indicated by a pulse width assigned to the channel has elapsed based on the expiration of a pulse width counter of the channel.

35. A system comprising:
a phase module adapted and configured to receive a phase counter value output from a phase counter module, and activate an activation signal when the phase counter value indicates a phase assigned to the channel; and
a pulse width module adapted and configured to receive the activation signal, and when the activation signal is activated, activate a waveform for a period of time indicated by a pulse width assigned to the channel, and deactivate the waveform after the period of time indicated by the pulse width assigned to the channel ends.

36. The system of claim 35, wherein the phase module is further adapted and configured to receive a value indicating a new phase assigned to the channel.

37. The system of claim 35, wherein the pulse width module is further adapted and configured to receive a value indicating a new pulse width assigned to the channel.

\* \* \* \* \*